(12) United States Patent
Koevoets et al.

(10) Patent No.: US 9,310,700 B2
(45) Date of Patent: Apr. 12, 2016

(54) LITHOGRAPHY METHOD AND APPARATUS

(75) Inventors: Adrianus Hendrik Koevoets, Mierlo (NL); Michael Jozef Mathijs Renkens, Sittard (NL); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 446 days.

(21) Appl. No.: 13/810,384

(22) PCT Filed: Jul. 18, 2011

(86) PCT No.: PCT/EP2011/062255
§ 371 (c)(1),
(2), (4) Date: Jan. 15, 2013

(87) PCT Pub. No.: WO2012/019874
PCT Pub. Date: Feb. 16, 2012

(65) Prior Publication Data
US 2013/0128246 A1 May 23, 2013

Related U.S. Application Data

(60) Provisional application No. 61/373,506, filed on Aug. 13, 2010.

(51) Int. Cl.
*G03B 27/52* (2006.01)
*G03B 27/32* (2006.01)
(Continued)

(52) U.S. Cl.
CPC .............. *G03F 7/70875* (2013.01); *B82Y 10/00* (2013.01); *B82Y 40/00* (2013.01); *G03F 7/0002* (2013.01); *G03F 7/70783* (2013.01)

(58) Field of Classification Search
CPC .............. G03F 7/0002; G03F 7/70416; G03F 7/70783; G03F 7/70875
USPC .................. 355/30, 72–77, 78, 95, 122, 132; 250/492.1, 492.2, 492.22, 548; 430/5, 430/8, 22, 30, 311, 312, 321, 394
See application file for complete search history.

(56) References Cited

U.S. PATENT DOCUMENTS 4,731,155 A    3/1988  Napoli et al.
5,581,324 A *  12/1996 Miyai et al. ..................... 355/53
(Continued)

FOREIGN PATENT DOCUMENTS

JP   2002-353110 A   12/2002
JP   2007-116148 A   5/2007
(Continued)

OTHER PUBLICATIONS

International Search Report directed to related International Patent Application No. PCT/EP2011/062255, mailed Oct. 12, 2011; 2 pages.
(Continued)

*Primary Examiner* — Christina Riddle
(74) *Attorney, Agent, or Firm* — Sterne, Kessler, Goldstein & Fox P.L.L.C.

(57) ABSTRACT

In an embodiment, a lithography method is disclosed that includes providing a providing a first heat load to a first area of an object, and providing a second heat load to a second area of the object, wherein the second heat load is configured to ensure a deformation of the first area of the object caused by providing both the first heat load and the second heat load is smaller than a deformation of the first area of the object caused by providing only the first heat load.

20 Claims, 29 Drawing Sheets

(51) Int. Cl.
*G03B 27/02* (2006.01)
*G03F 7/20* (2006.01)
*B82Y 10/00* (2011.01)
*B82Y 40/00* (2011.01)
*G03F 7/00* (2006.01)

(56) References Cited

U.S. PATENT DOCUMENTS

| | | | |
|---|---|---|---|
| 5,772,905 A | 6/1998 | Chou | |
| 6,334,960 B1 | 1/2002 | Willson et al. | |
| 6,753,508 B2 | 6/2004 | Shirakawa | |
| 6,936,181 B2* | 8/2005 | Bulthaup et al. | 216/44 |
| 7,132,206 B2* | 11/2006 | Kindt | 430/30 |
| 7,830,493 B2 | 11/2010 | Tinnemans et al. | |
| 2003/0235682 A1* | 12/2003 | Sogard | G03F 7/70233 428/195.1 |
| 2004/0124566 A1 | 7/2004 | Sreenivasan et al. | |
| 2005/0274693 A1 | 12/2005 | Heidari et al. | |
| 2006/0007413 A1* | 1/2006 | Nanba | 355/30 |
| 2006/0115999 A1 | 6/2006 | Sreenivasan et al. | |
| 2008/0153312 A1* | 6/2008 | Sreenivasan et al. | 438/780 |
| 2008/0158526 A1* | 7/2008 | Hennus et al. | 355/30 |
| 2009/0273119 A1 | 11/2009 | Imai | |
| 2010/0072665 A1* | 3/2010 | Imai et al. | 264/293 |
| 2010/0104984 A1* | 4/2010 | Shiobara et al. | 430/319 |

FOREIGN PATENT DOCUMENTS

| | | |
|---|---|---|
| JP | 2008-522448 A | 6/2008 |
| WO | WO 02/067055 A2 | 8/2002 |

OTHER PUBLICATIONS

International Preliminary Report on Patentability and Written Opinion of the International Searching Authority directed to related International Patent Application No. PCT/EP2011/062255, mailed Feb. 19, 2013; 4 pages.

Haisma, J., et al., "Mold-assisted nanolithography: A process for reliable pattern replication," Journal of Vacuum Science & Technology B, vol. 14, No. 6, Nov./Dec. 1996; pp. 4124-4128.

* cited by examiner

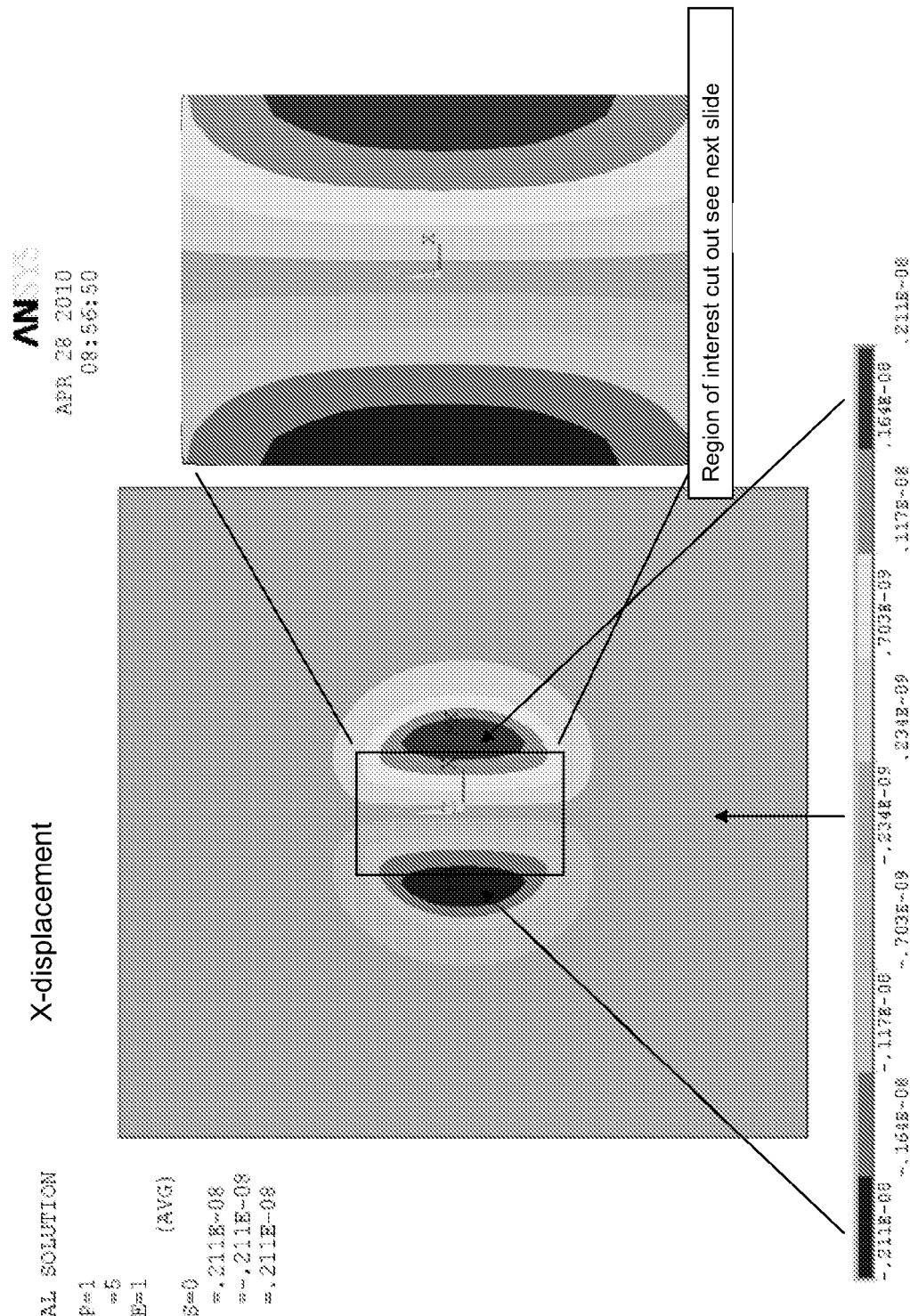

Figure 6c

LITHOGRAPHY METHOD AND APPARATUS

CROSS-REFERENCE TO RELATED APPLICATIONS

This application claims the benefit of U.S. provisional application 61/373,506, which was filed on Aug. 13, 2010 and which is incorporated herein in its entirety by reference.

FIELD

The present invention relates to a lithography method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to small features (e.g., nanometer sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable liquid medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface. The recesses define pattern features of the patterned surface of the imprint lithography template. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

SUMMARY

Bringing the imprintable medium into a non-flowable or frozen state, for example by illuminating the imprintable medium on a location of the substrate with actinic radiation, provides a heat load to the location of the substrate. This heat load can have the effect of deforming the substrate, including e.g. the part of the substrate facing the patterned surface of the imprint lithography template, which is not desirable. For example, because the part of the substrate facing the patterned surface of the imprint lithography template is deforming during bringing the imprintable medium into a non-flowable or frozen state, the position of a point of this part of the substrate displaces with respect to the patterned surface or the imprint lithography template. This in turn may lead to a non-optimal or even defective pattern on the substrate.

It is desirable, for example, to improve the pattern on a substrate.

In an embodiment, there is provided a method, such as a lithography method—e.g. an imprint lithography method, comprising limiting or preventing deformation of a substrate by providing a counterforce to the force promoting the deformation. In an embodiment the counterforce is provided by heating an area of the substrate. In an embodiment the force promoting the deformation is caused by heating an area of the substrate.

According to an aspect, there is provided a lithography method comprising providing a first heat load to a first area of an object, providing a second heat load to a second area of the object, wherein the second heat load is configured to ensure a deformation of the first area of the object caused by providing both the first heat load and the second heat load is smaller than a deformation of the first area of the object caused by providing only the first heat load.

According to an aspect, there is provided a lithography apparatus comprising a first heat output configured to provide a first heat load to a first area of an object, a second heat output configured to provide a second heat load to a second area of the object to ensure a deformation of the first area of the object caused by providing both the first heat load and the second heat load is smaller than a deformation of the first area of the object caused by providing only the first heat load.

BRIEF DESCRIPTION OF THE DRAWINGS

Specific embodiments of the invention will be described with reference to the accompanying figures, in which.

DETAILED DESCRIPTION

Figure 1A:
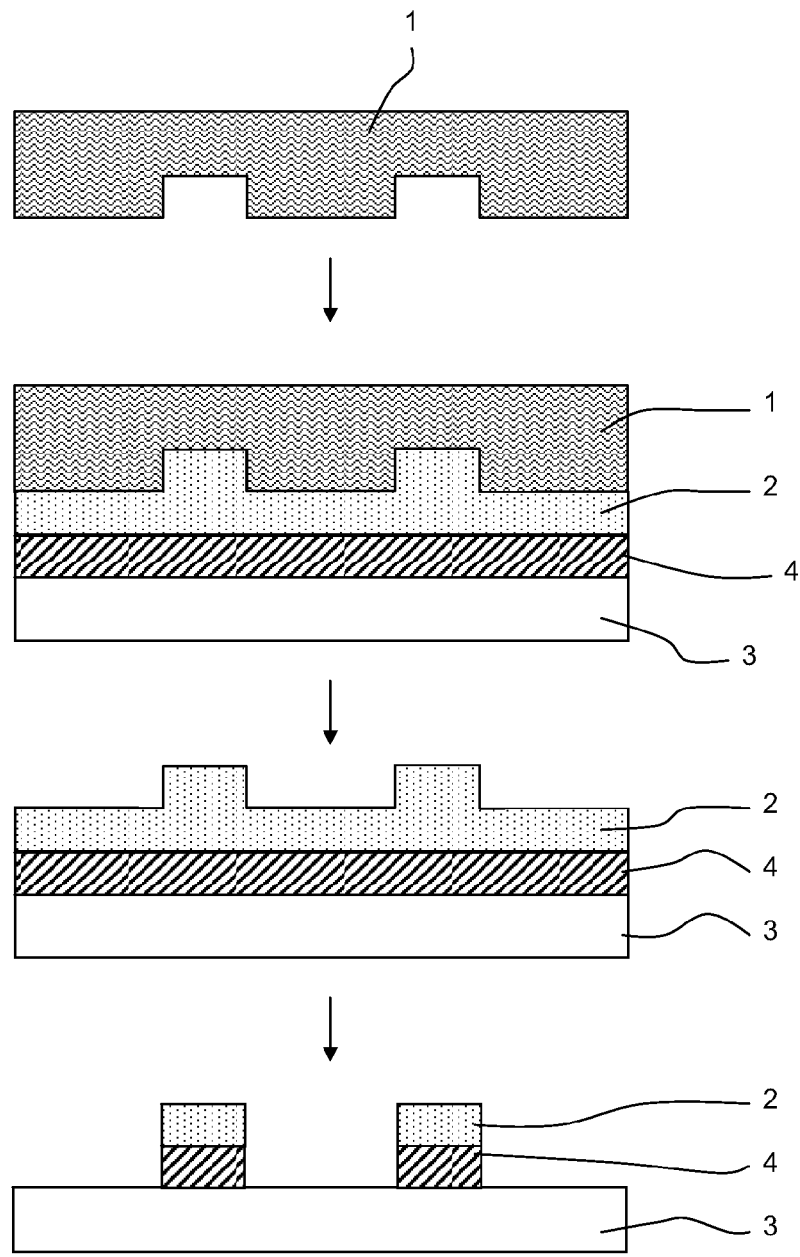
FIGS. 1a and 1b schematically depict examples of, respectively, hot imprint, and UV imprint lithography.
Figure 1B:
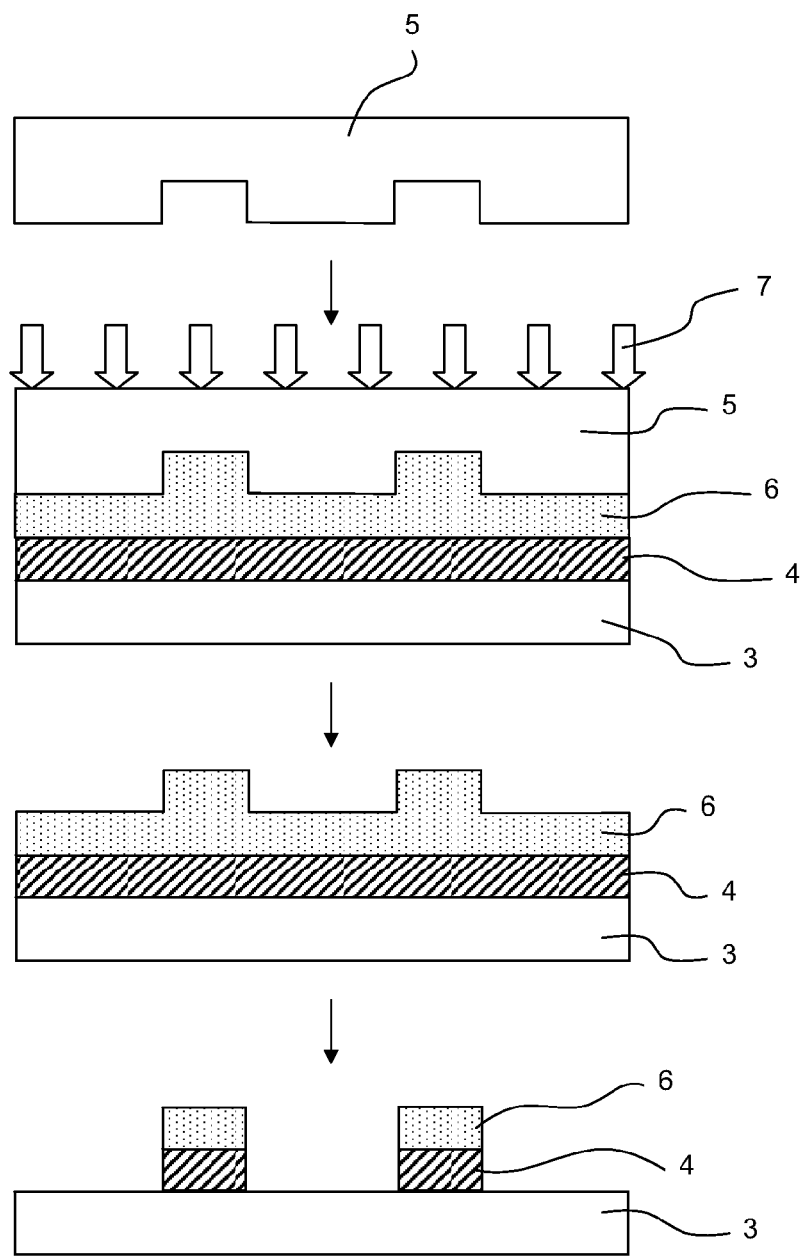

Examples of approaches to imprint lithography are schematically depicted in FIGS. 1a to 1b.

FIG. 1a shows an example of so-called hot imprint lithography (or hot embossing). In a typical hot imprint process, a template 1 is imprinted into a thermosetting or a thermoplastic imprintable medium 2, which has been cast on the surface of a substrate 3. The imprintable medium 2 may be, for example, resin. The resin may, for instance, be spin coated and baked onto the substrate surface or, as in the example illustrated, onto a planarization and transfer layer 4 of the substrate 3. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 1 may then be removed and the patterned resin cooled. In hot imprint lithography employing a layer of thermoplastic polymer resin, the thermoplastic resin is heated so that it is in a freely flowable state immediately prior to imprinting with the template 1. It may be necessary to heat a thermoplastic resin to a temperature considerably above the glass transition temperature of the resin. The template is pressed into the flowable resin and then cooled to below its glass transition temperature with the template 1 in place to harden the pattern. Thereafter, the template 1 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz imprint template 5 is applied to a UV-curable imprintable medium 6 in a similar manner to the process of FIG. 1a. However, instead of using heat or temperature cycling as in hot imprint, the pattern is solidified by curing the imprintable medium 6 with UV radiation 7 that is applied through the quartz imprint template 5 onto the imprintable medium 6. After removal of the template 5, the imprintable medium 6 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

FIG. 2a and FIG. 2b also relate to UV imprint. The imprint template 5 contacts the imprintable medium 6 provided on the substrate 3. FIG. 2a shows the situation at t=0, that is the moment in time UV radiation 7 is started to be provided to cure the imprintable medium 6. Also shown are two points on the substrate, A and B, which are separated from each other by a distance x. FIG. 2b shows the situation at a later instant in time (t=$t_1$) when UV radiation 7 is still being provided to cure the imprintable medium 6. As can be seen points A and B have moved further away from each other by a distance $\Delta x$ ($\Delta x>0$ in this case) compared to the situation at t=0. This is caused by the heat load provided by the UV radiation 7 to the substrate 3 which deforms the substrate 3. It will be clear that not only points A and B of the substrate 3 displace with respect to the patterned surface of the imprint template 5. For example, points of the substrate between points A and B displace with respect to the patterned surface of the imprint template 5 going from t=0 to t=$t_1$. This may lead to a non-optimal or even a defective pattern on the substrate. For example, going from t=0 to t=$t_1$, the imprintable medium 6 is being cured by the UV radiation 7. During the curing process the imprintable medium solidifies. As the patterned surface of the imprint template 5 and the part of the substrate 3 facing this patterned surface displace with respect to each other during the time the imprintable medium 6 solidifies, pattern features being formed in the imprintable medium 6 from t=0 onwards may break, which is undesirable. Although the problem is only described with respect to one direction, which is in the A-B direction, it will be clear that the problem may also be present in another direction, which is in the direction perpendicular to the A-B direction and parallel to the surface of the substrate 3. More generally, the problem may be present in all directions parallel to the surface of the substrate 3.

Figure 2:
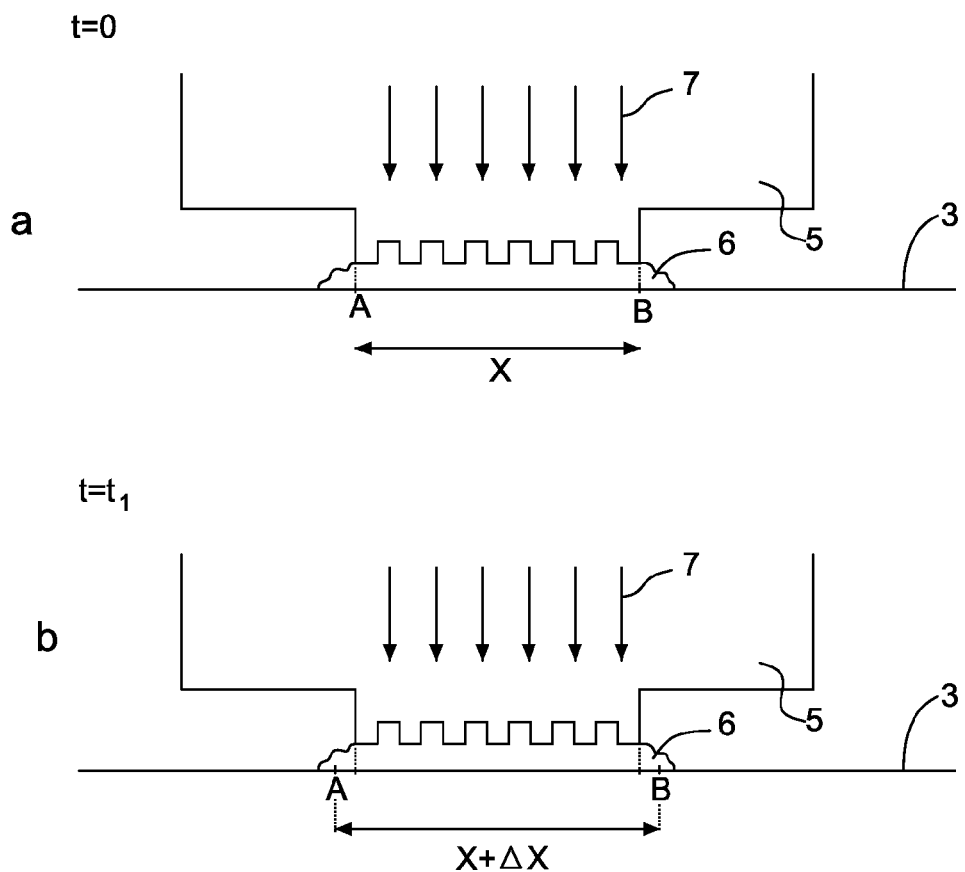
FIG. 2 schematically depicts an imprint lithography method.
Figure 3:
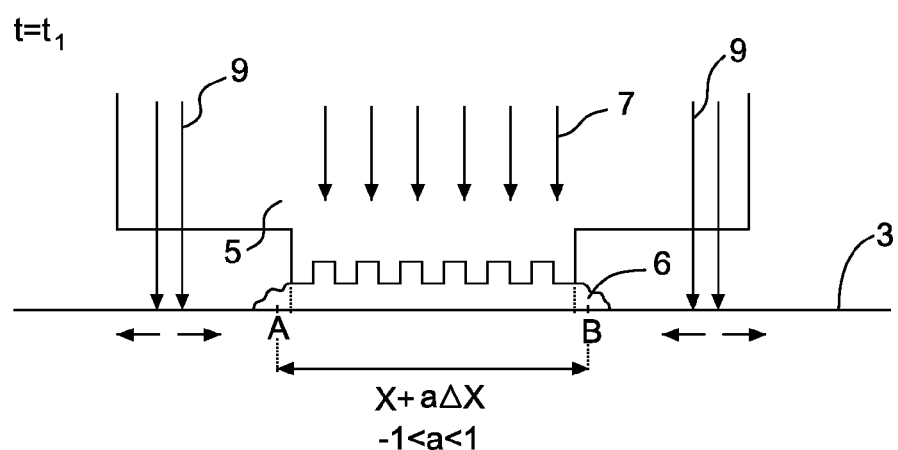
FIG. 3 schematically depicts an imprint lithography method according to an embodiment of the invention.

In an embodiment of the invention, there is provided a method of limiting or preventing the substrate deformation by providing a counterforce to the force promoting deformation. FIG. 3 shows schematically an imprint lithography method according to an embodiment of the invention. Again an imprint template 5, imprintable medium 6, substrate 3, and UV radiation 7 are shown. As in FIG. 2, the energy from UV radiation 7 promotes deformation of the substrate. However, compared to FIG. 2, additional UV radiation 9 is shown. FIG. 3 shows the situation at t=$t_1$. Similar to FIG. 2 also in this case at t=0 UV radiation 7 is started to be provided to cure the imprintable medium 6. FIG. 3 shows the situation at t=$t_1$, thus the same amount of time after t=0 as is the case with respect to the situation shown in FIG. 2b. As can be seen from FIG. 3, at t=$t_1$ the distance between points A and B (same points on substrate as described with respect to FIG. 2) is closer to the distance between points A and B at t=0 than is the case for the situation shown in FIG. 2b. This is due to the deforming effect the additional UV radiation 9 has on the part of the substrate 3 facing the patterned surface of the imprint template 5. This will be further described hereafter. The deformation of the substrate facing the patterned surface of the imprint template 5 as shown in FIG. 3 is smaller compared to the situation as shown in FIG. 2b. From this it is clear that applying the additional UV radiation 9 may lead to a more optimal and/or less defective pattern on the substrate 3 and thus an improved pattern on the substrate 3.

Figure 4:
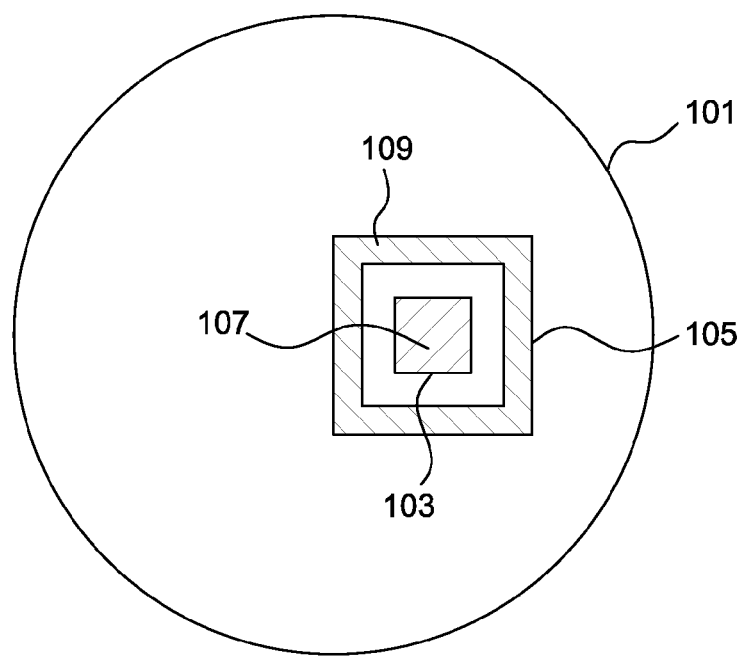
FIG. 4 schematically depicts a lithography method according to an embodiment of the invention.

FIG. 4 shows schematically a lithography method, for example an imprint lithography method, to be performed with a lithography apparatus, for example an imprint lithography apparatus, according to an embodiment of the invention. The method comprises providing a first heat load 107 to a first area 103 of an object 101, providing a second heat load 109 to a second area 105 of the object 101, wherein the second heat load 109 is configured to ensure a deformation of the first area 103 of the object 101 caused by providing both the first heat load 107 and the second heat load 109 is smaller than a deformation of the first area 103 of the object 101 caused by providing only the first heat load 107. The object 101 may be, for example, a substrate (see substrate 3 in FIG. 3). The first area 103 may be the part of the substrate illuminated by UV radiation (see substrate 3 and radiation 7 in FIG. 3), that is, normally, the part of the substrate facing the patterned surface of the imprint template (see substrate 3 and template 5 in FIG. 3). The second area 105 may be the part of the substrate illuminated by additional UV radiation (see substrate 3 and additional radiation 9 in FIG. 3). The first heat load 107 may be the heat load provided by the UV radiation (to solidify the imprintable medium; see imprintable medium 6 and radiation 7 in FIG. 3). The second heat load 109 may be the heat load provided by the additional UV radiation (see additional radiation 9 in FIG. 3). The principle as described with respect to the embodiment of the invention as shown in FIG. 3 also holds for the situation shown in FIG. 4. That is, by applying the second heat load 109 it is ensured a deformation of the first area 103 of the object 101 caused by providing both the first heat load 107 and the second heat load 109 is smaller than a deformation of the first area 103 of the object 101 caused by providing only the first heat load 107.

Figure 5A:
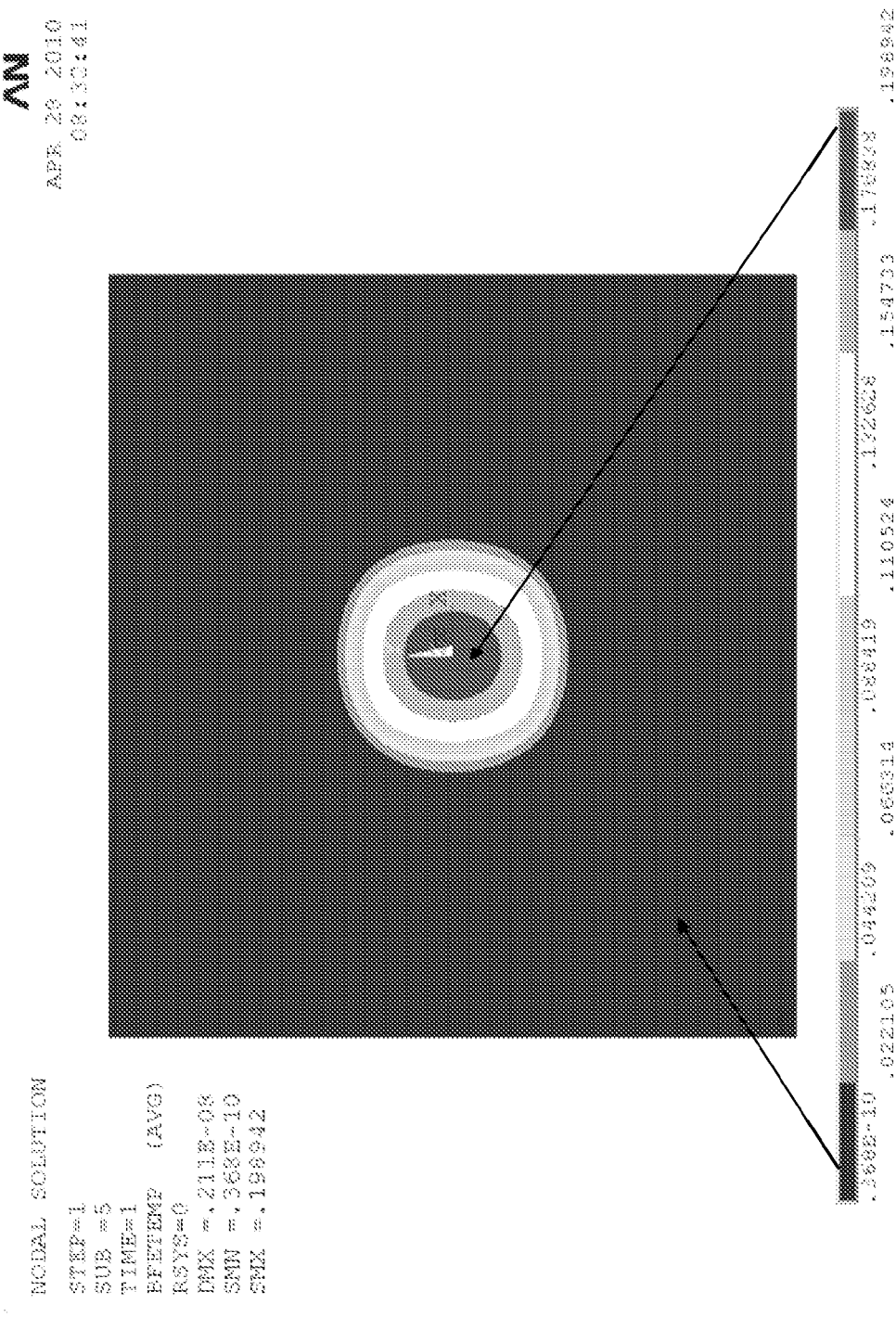
FIG. 5 depicts finite element method results of providing a first heat load to a first area of an object.
Figure 5C:
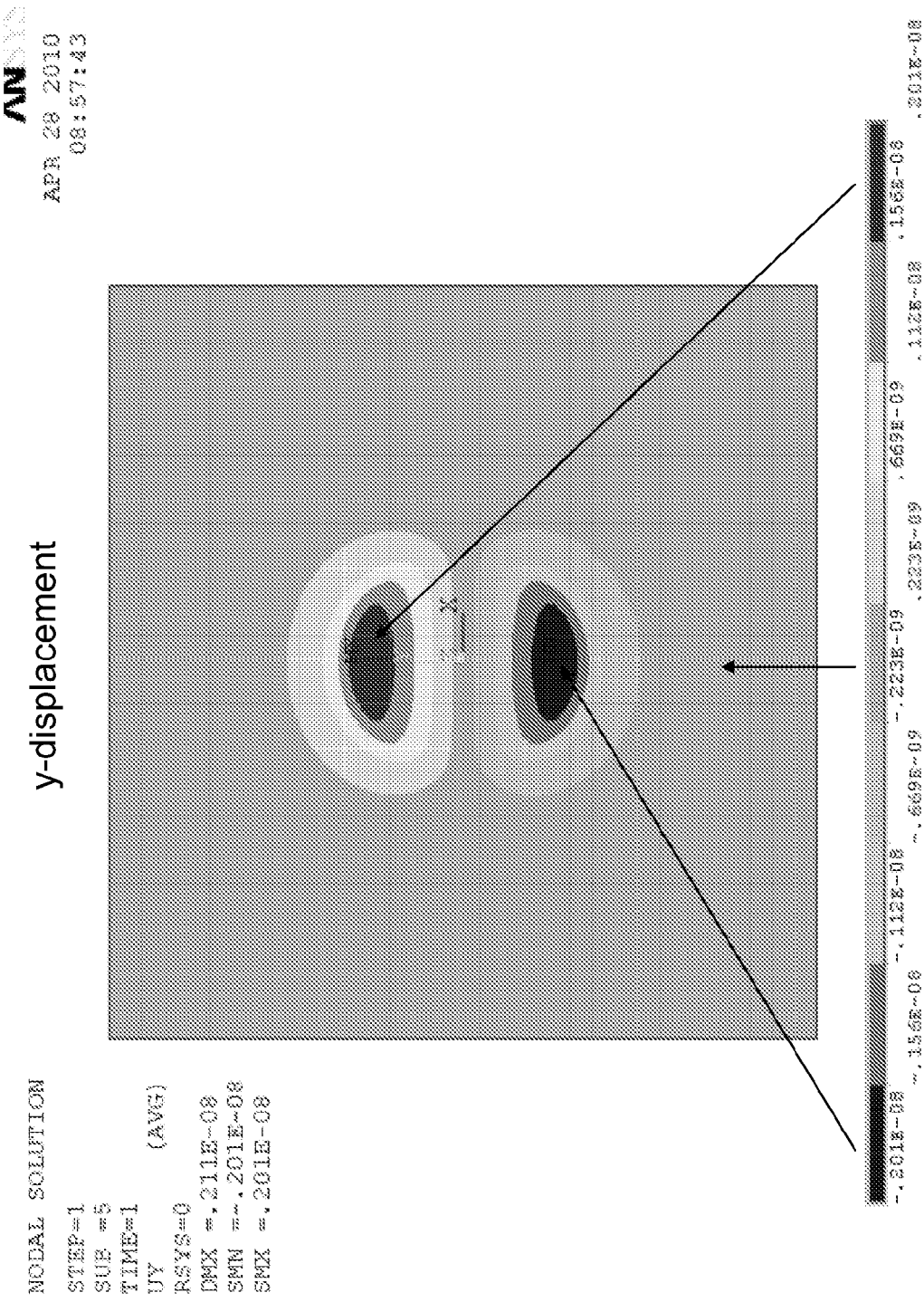
Figure 5D:
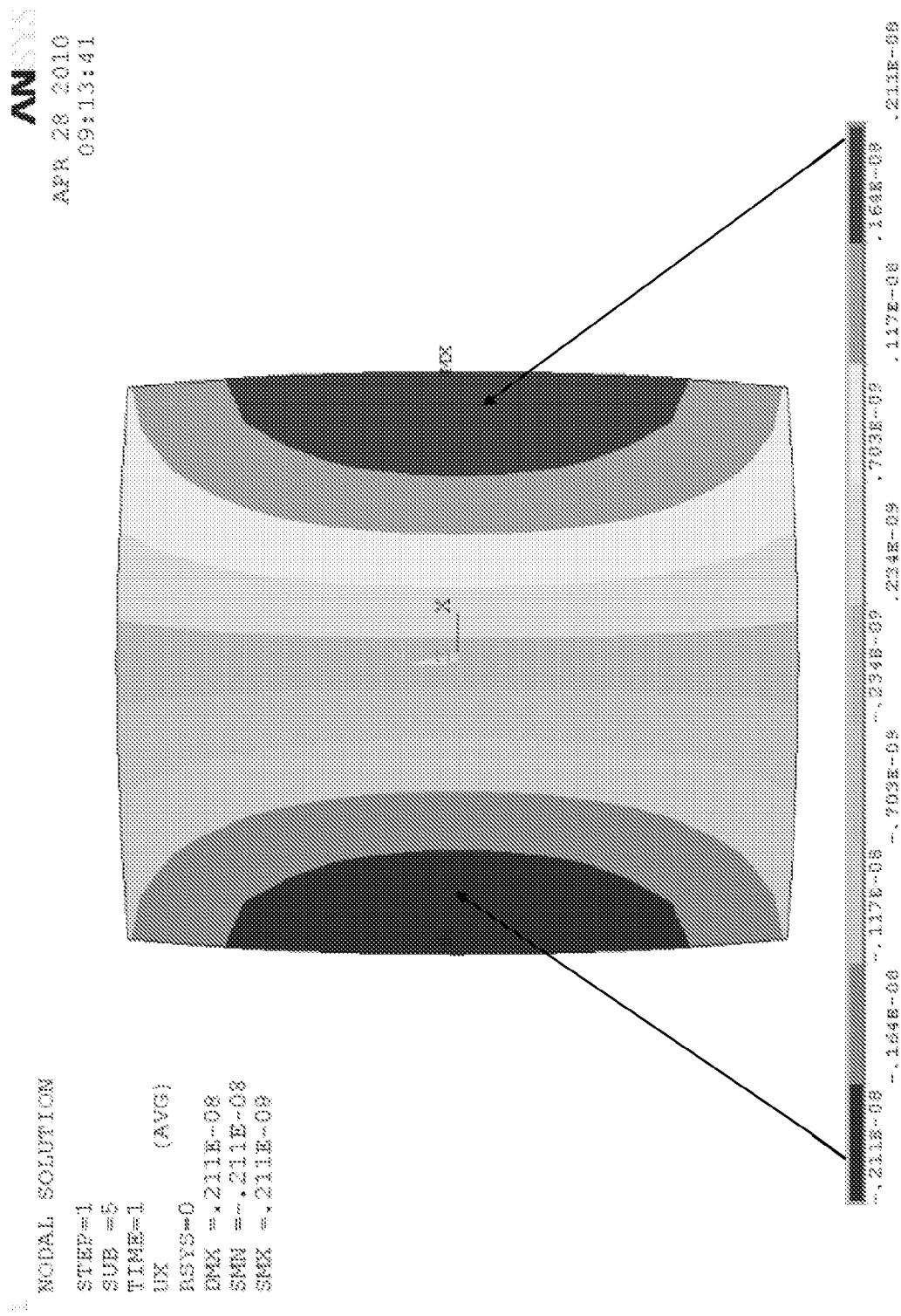
Figure 5E:
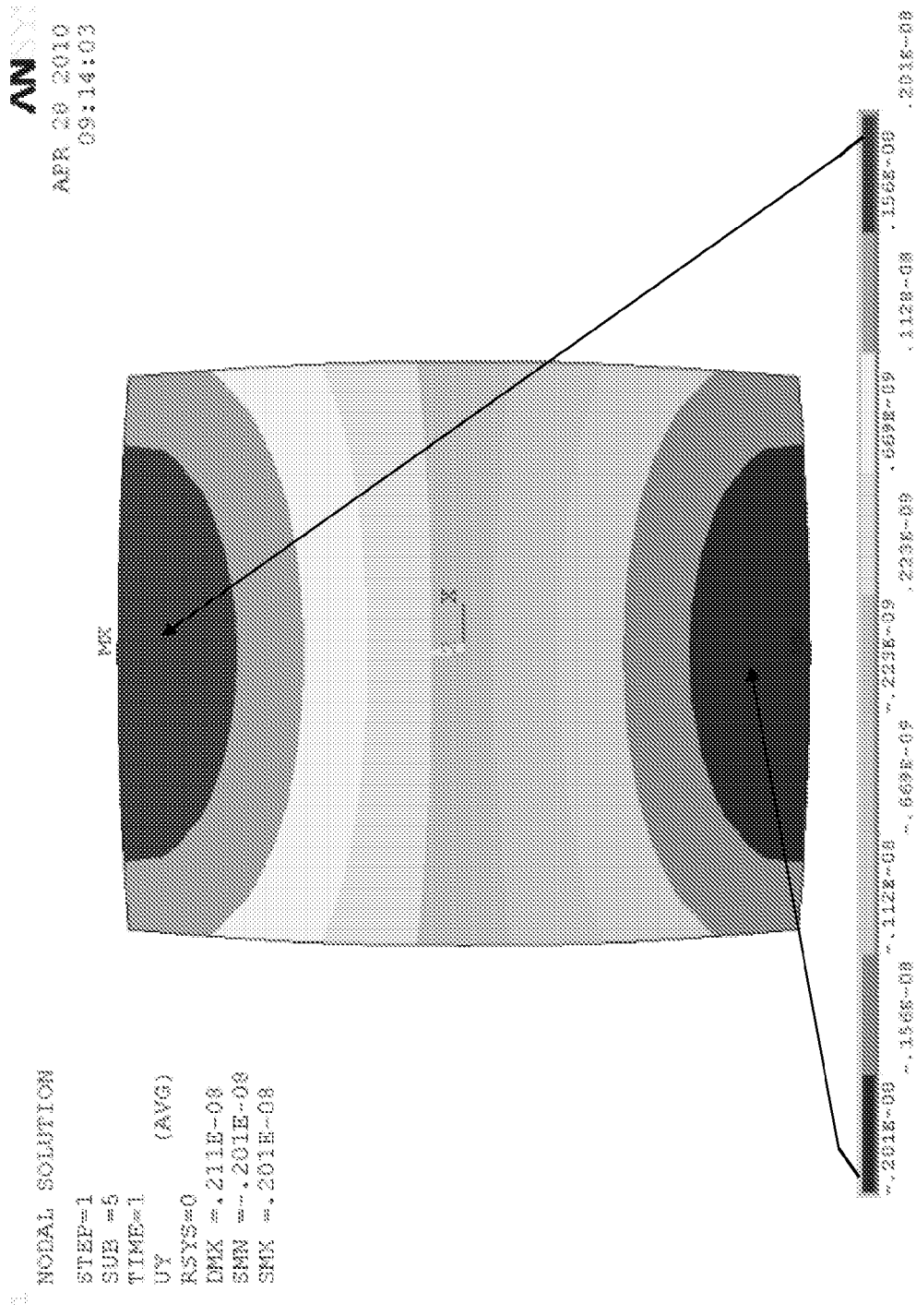
Figure 6A:
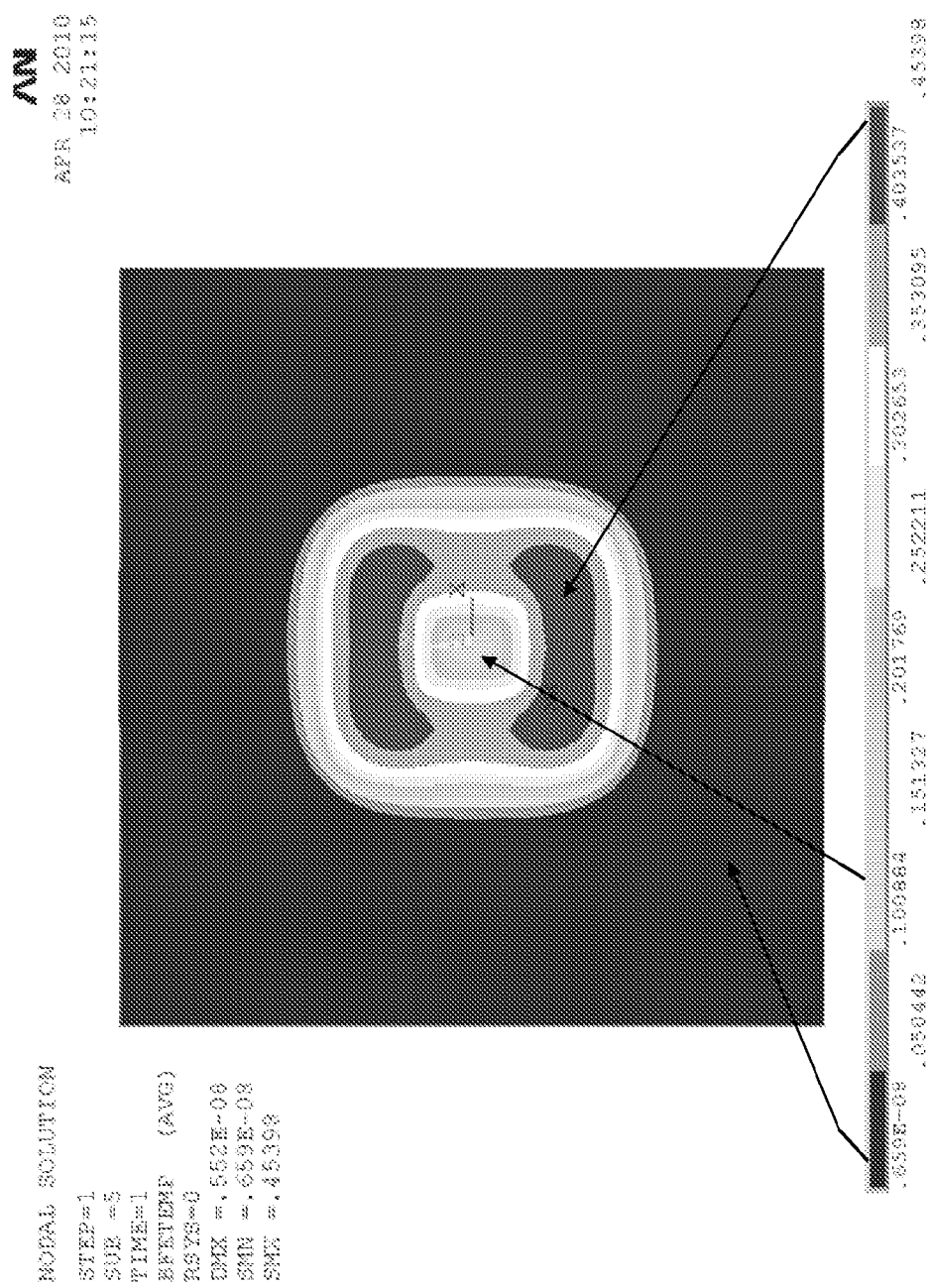
FIG. 6 depicts finite element method results of providing a second heat load to a second area of an object.
Figure 6B:
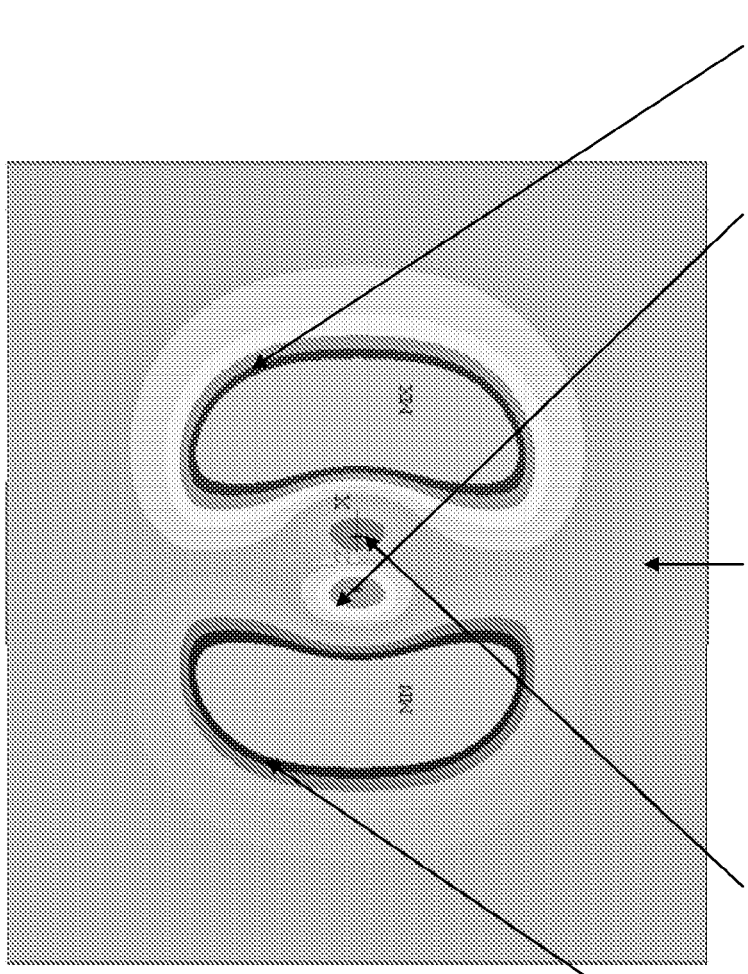
Figure 6D:
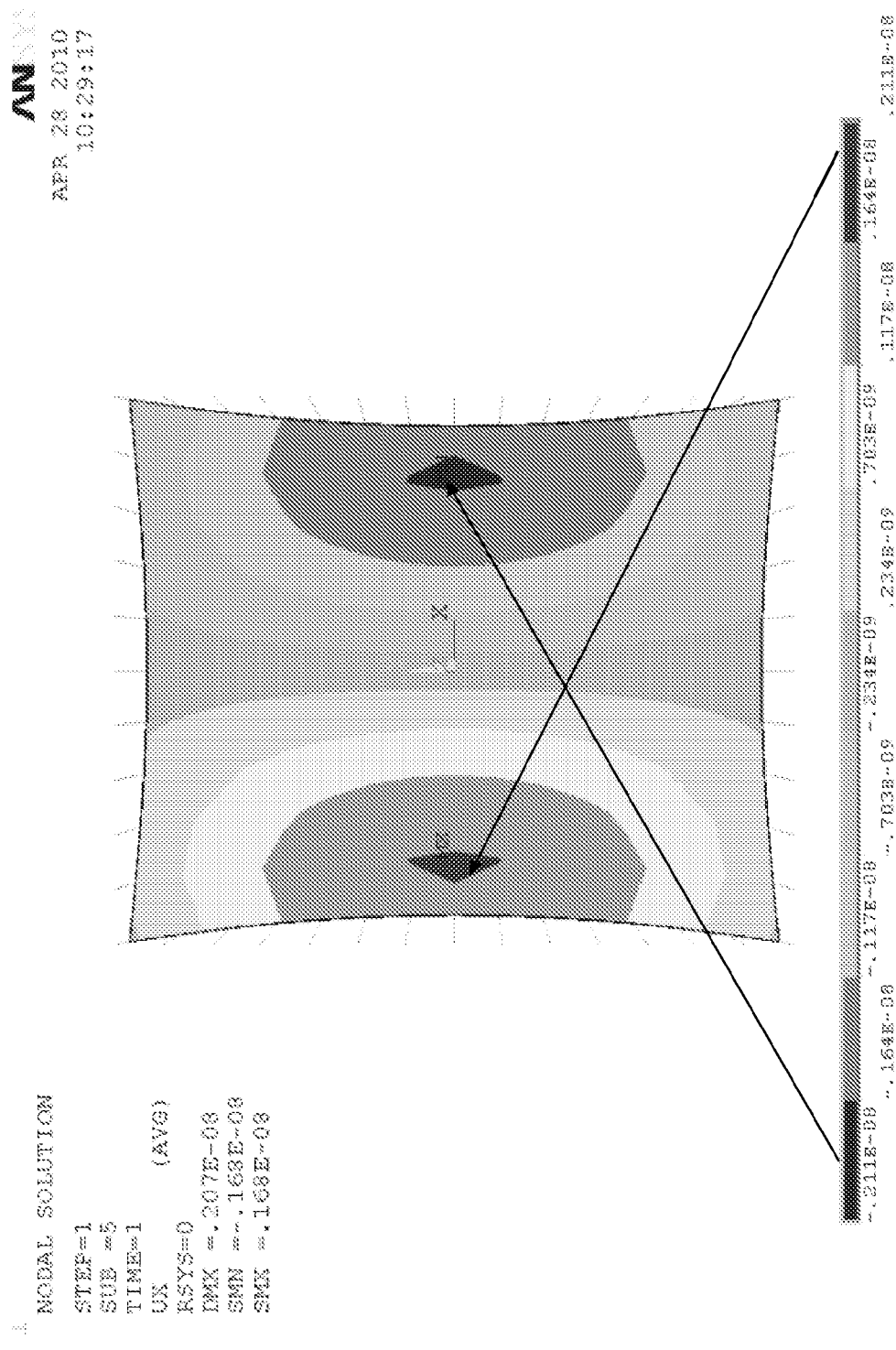
Figure 6E:
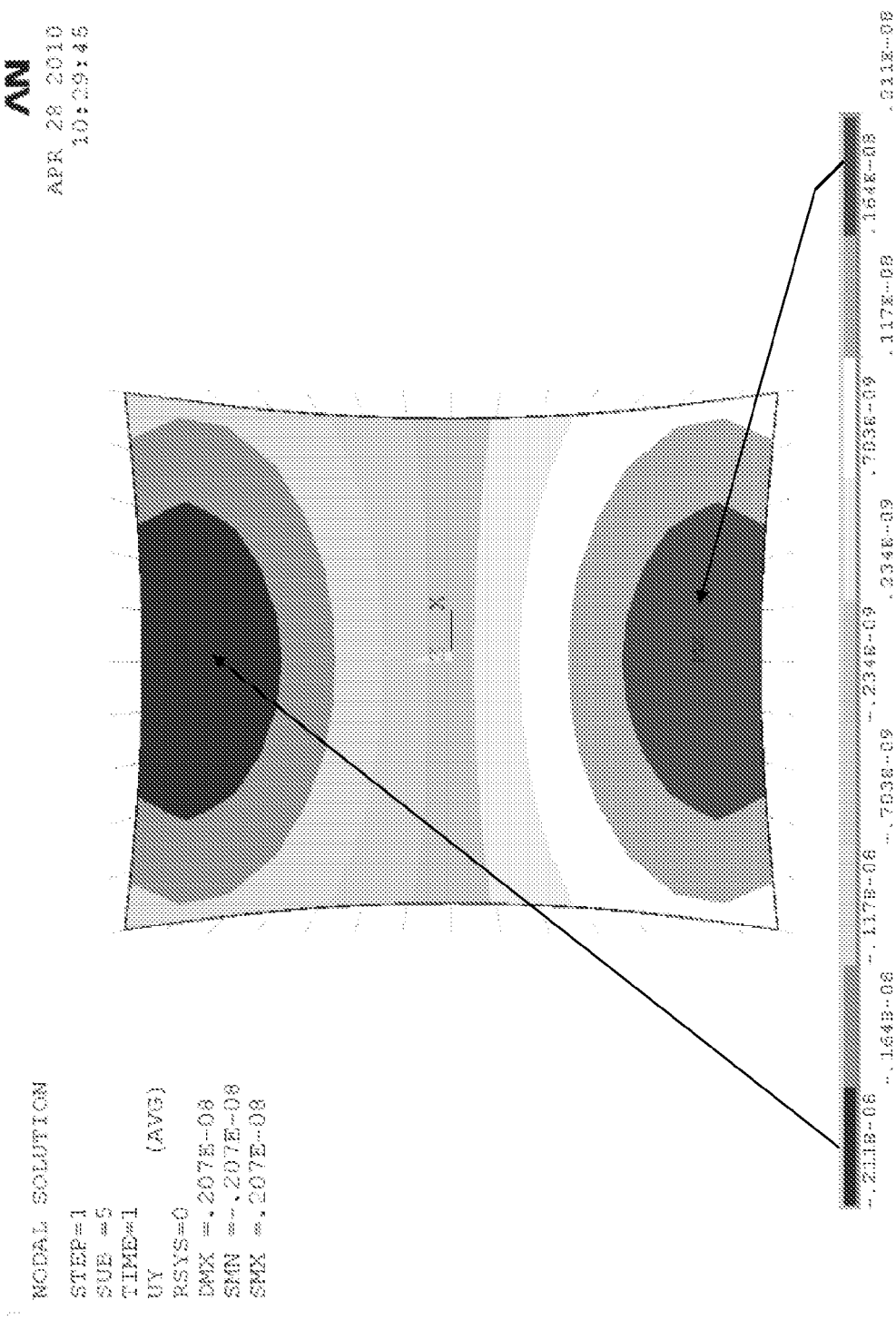
Figure 7A:
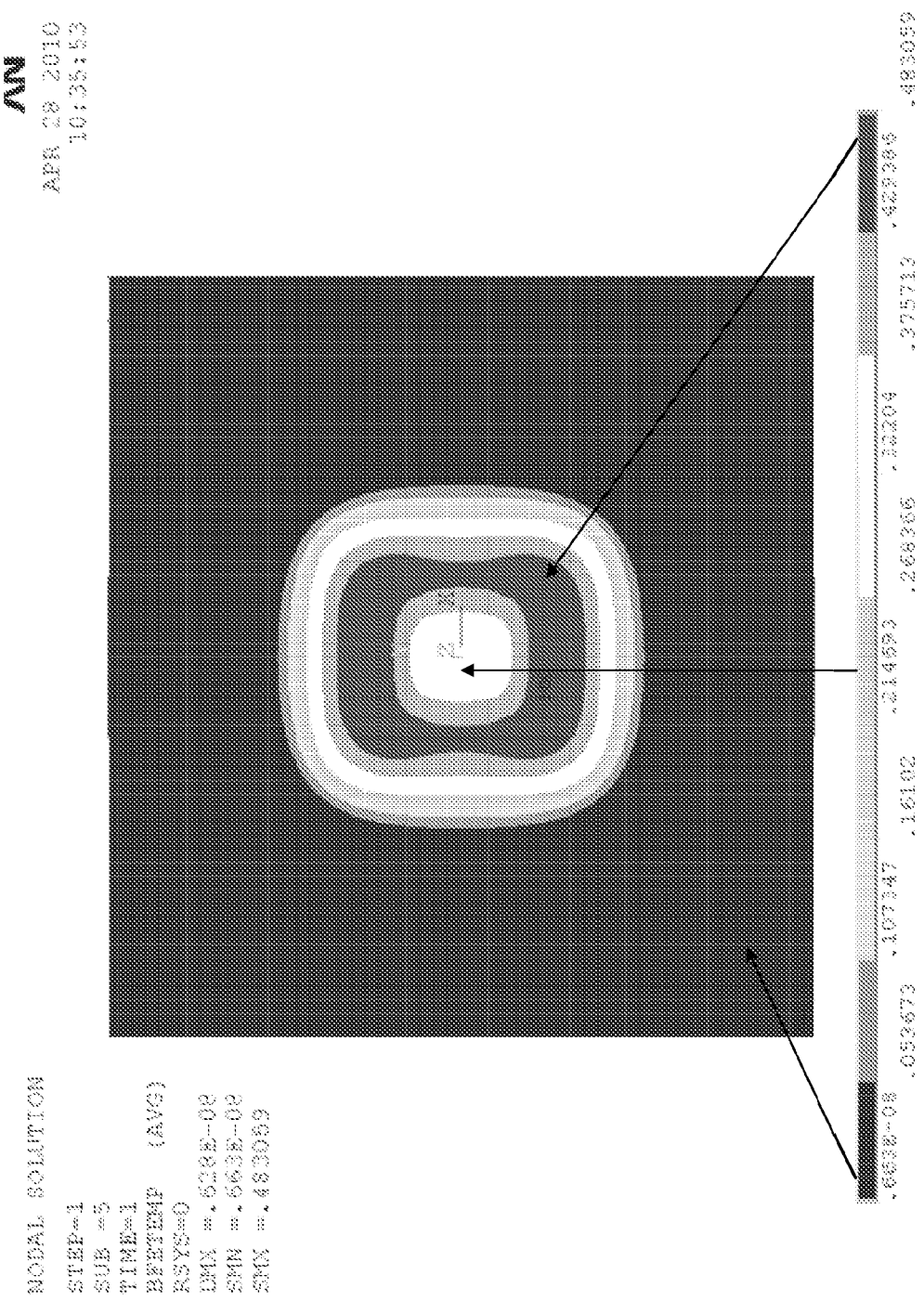
FIG. 7 depicts finite element method results of providing both the first heat load of FIG. 5 and the second heat load of FIG. 6.
Figure 7B:
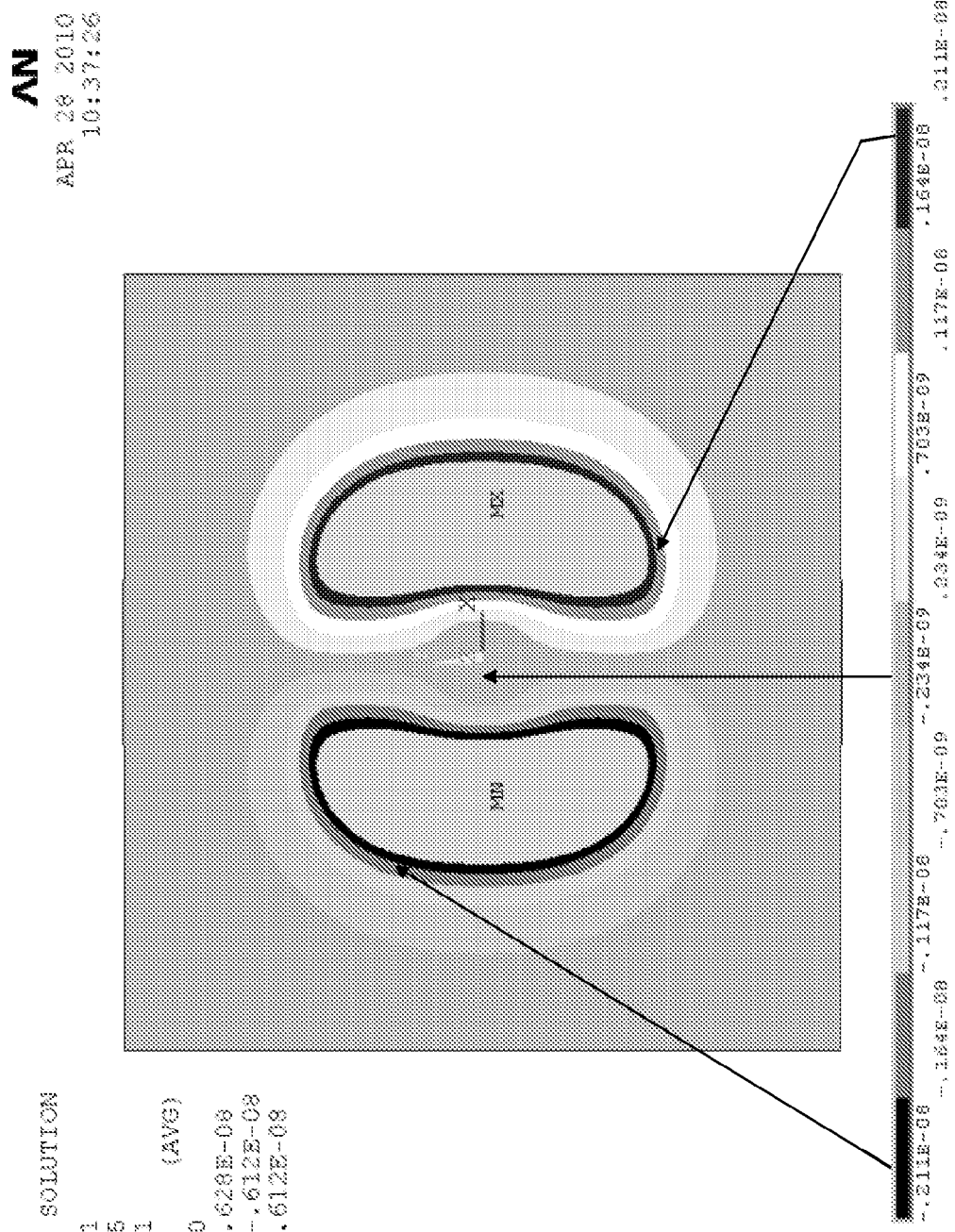
Figure 7C:
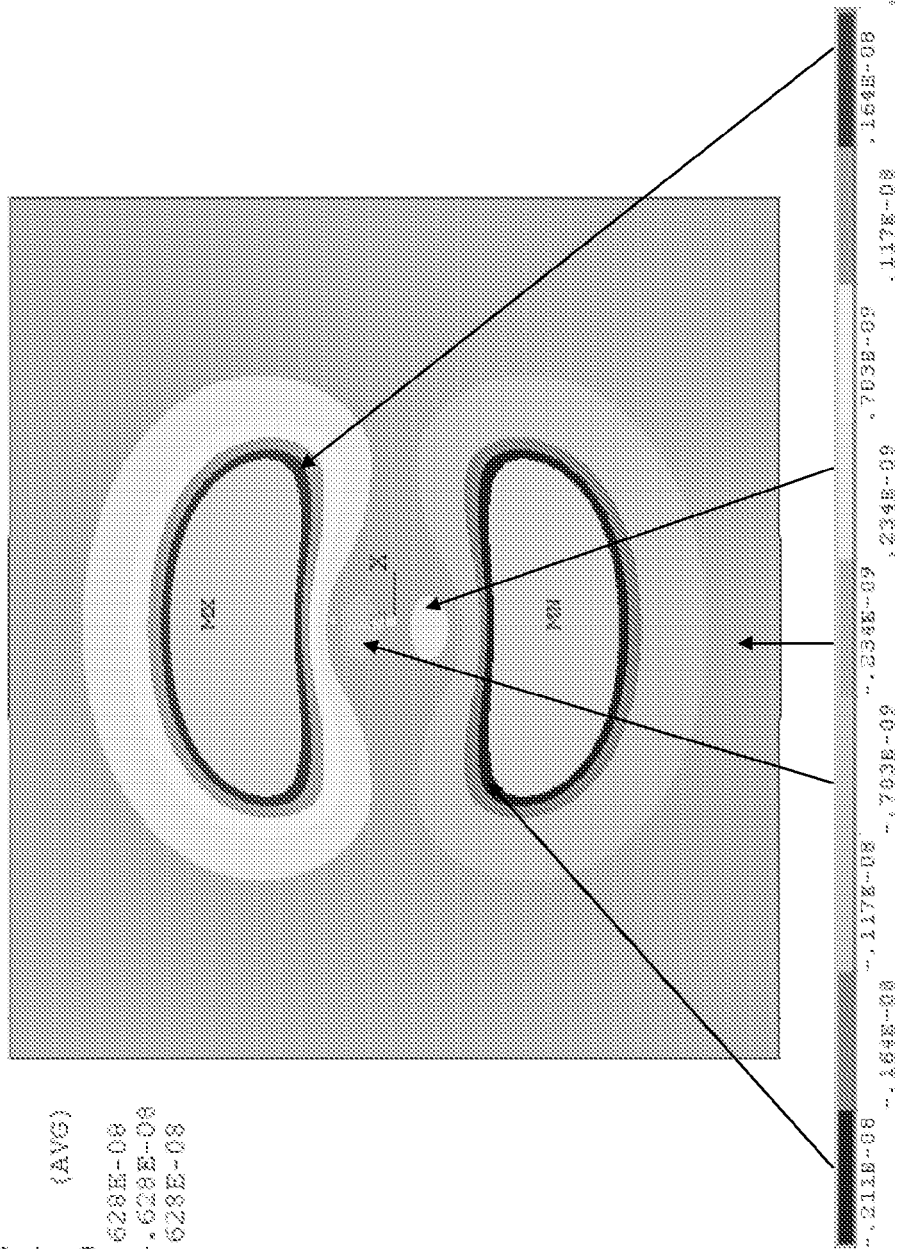
Figure 7D:
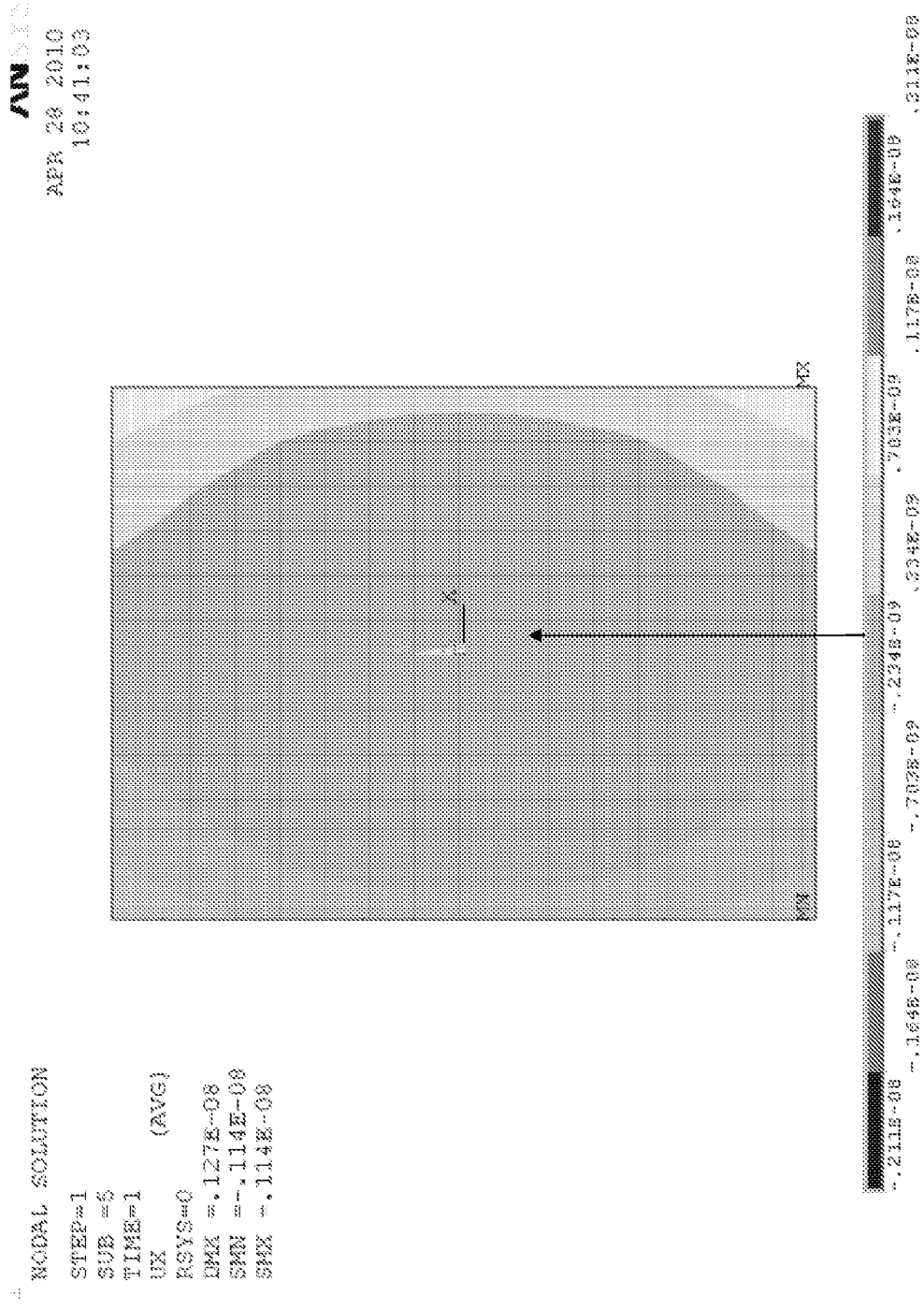
Figure 7E:
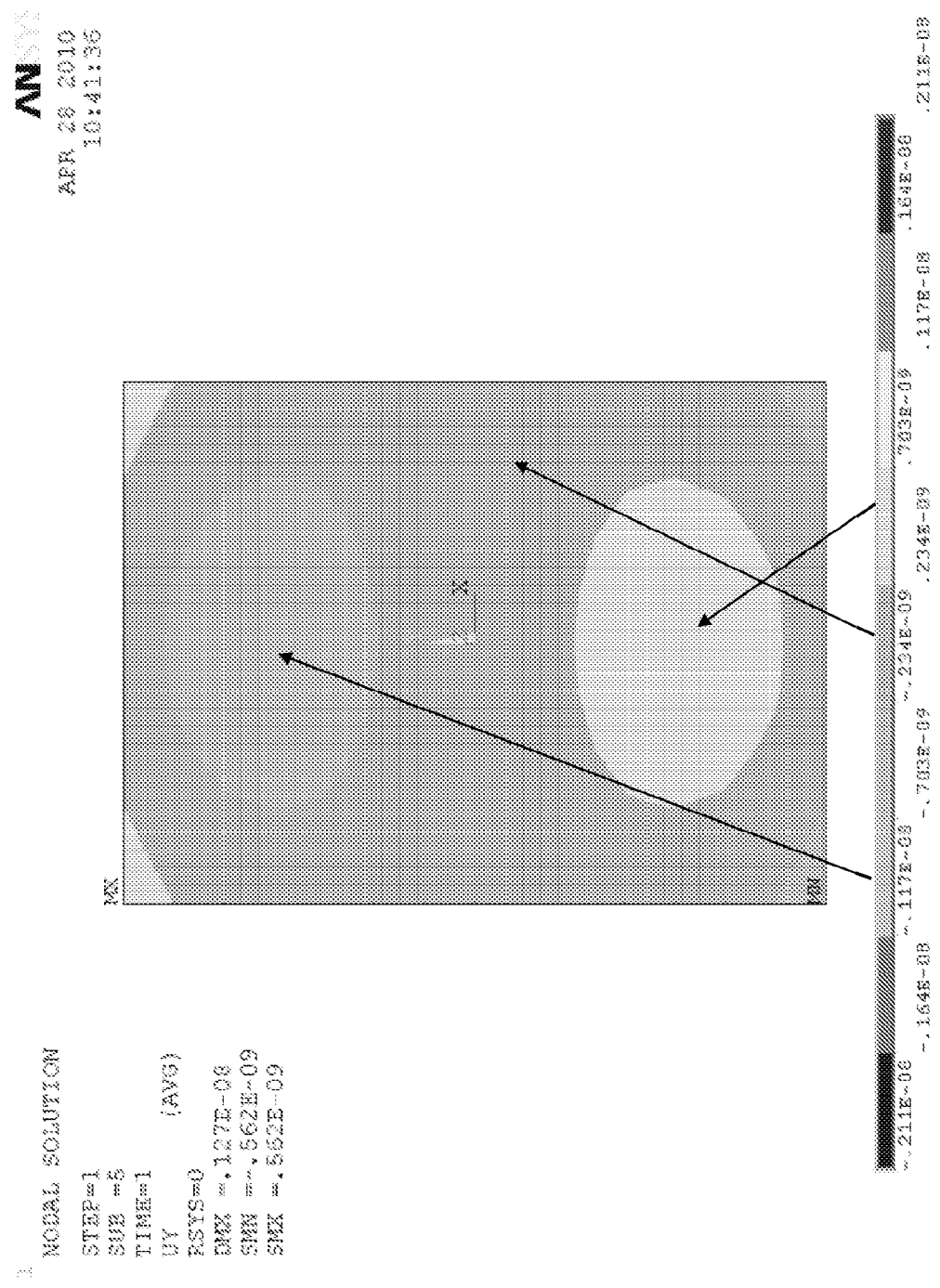
Figure 8A:
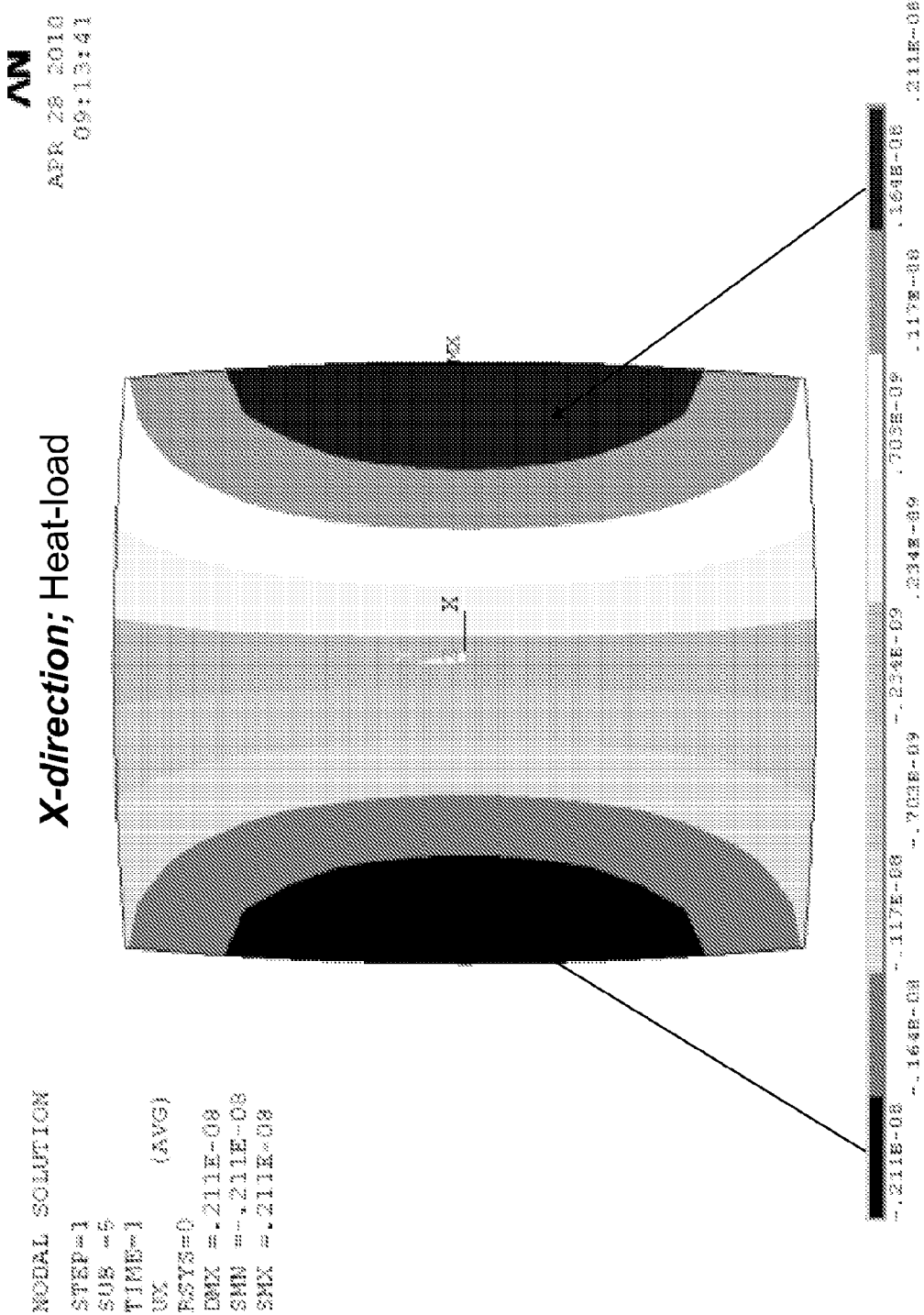
FIG. 8 depicts the finite element method results of the first area of the object of FIGS. 5 to 7.
Figure 8B:
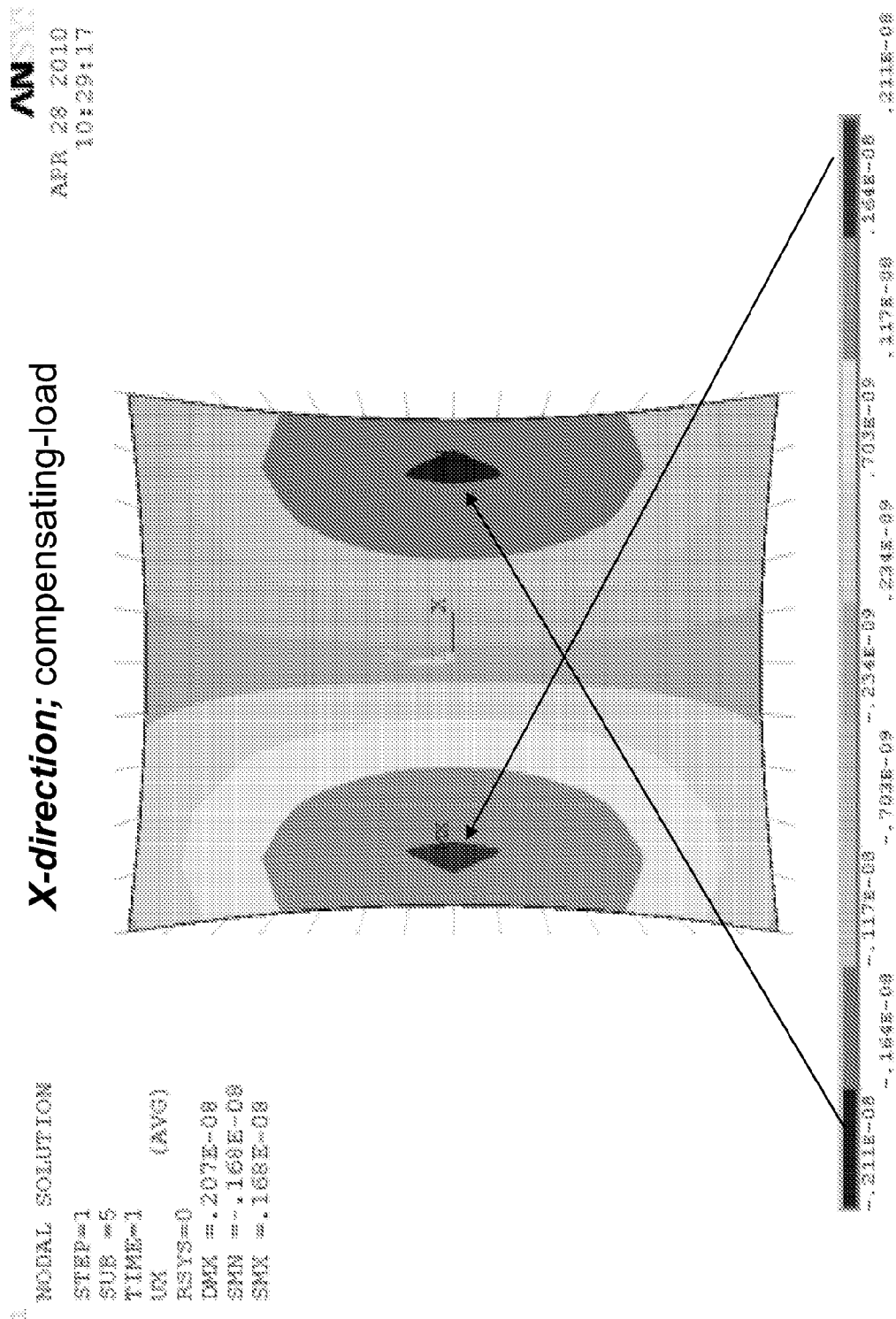
Figure 8C:
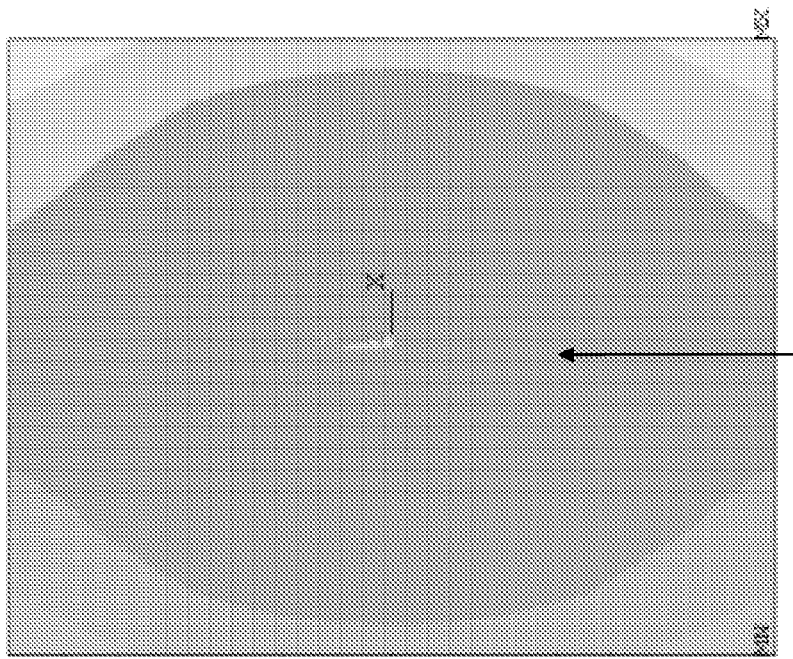
Figure 8D:
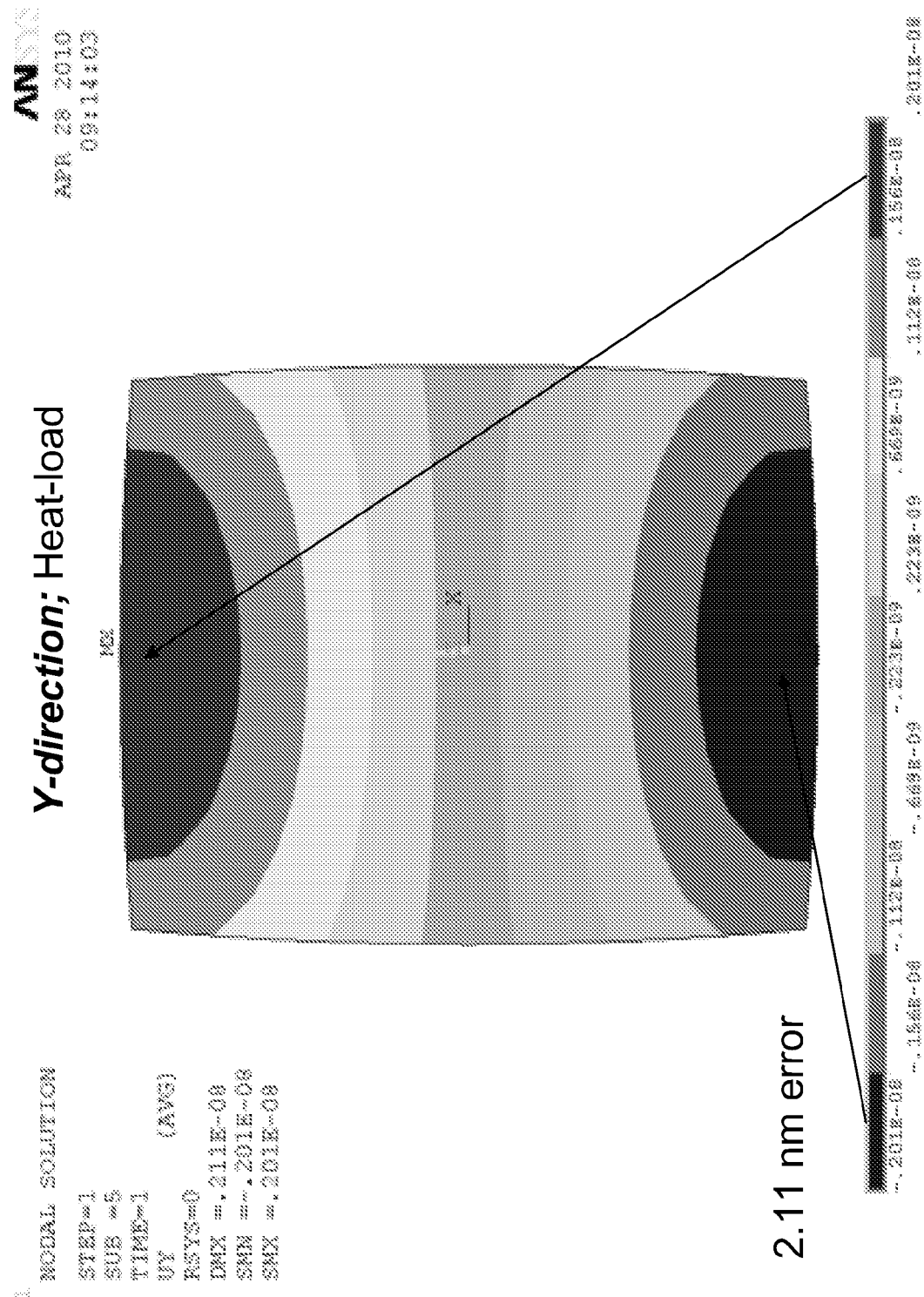
Figure 8E:
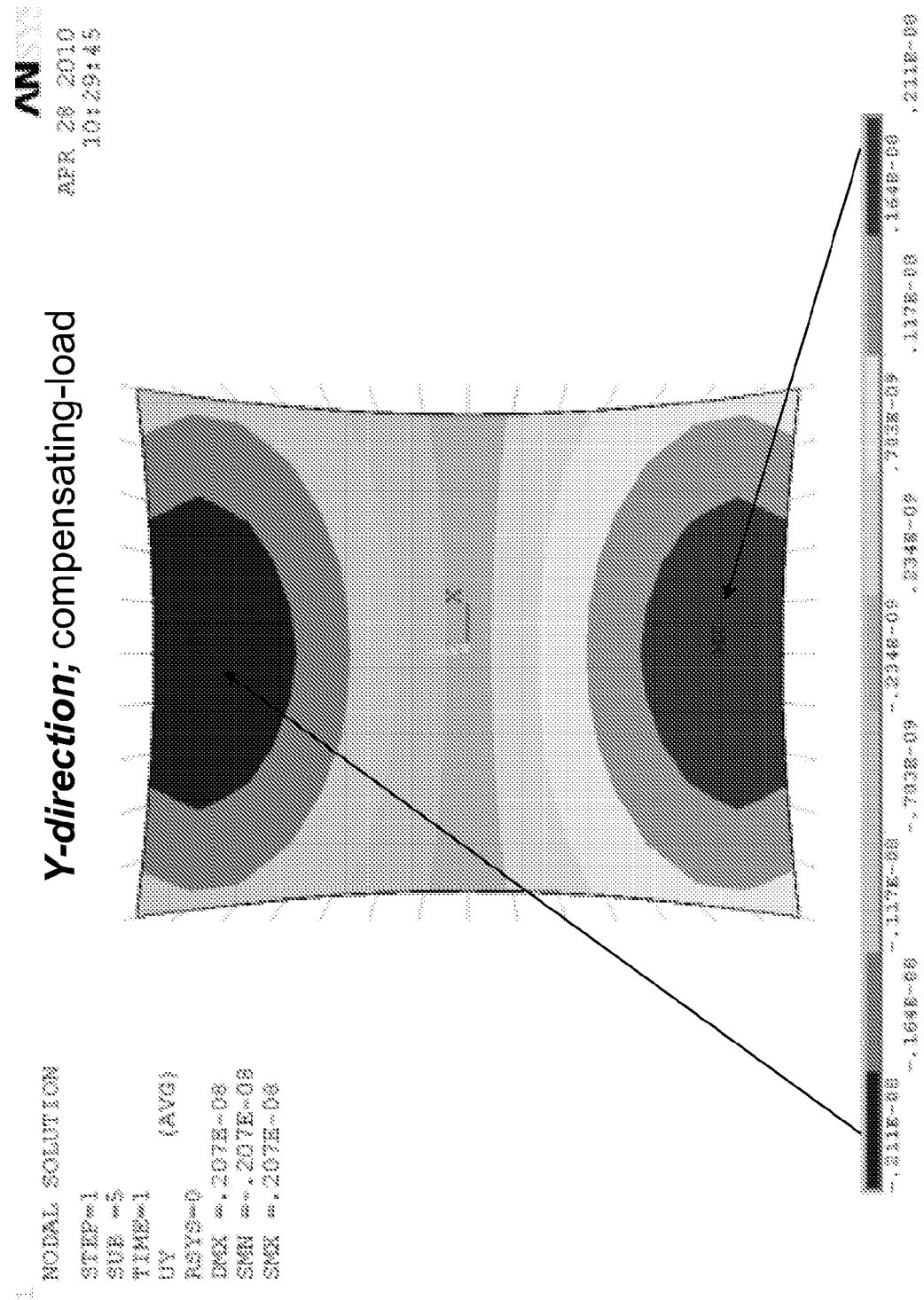
Figure 8F:
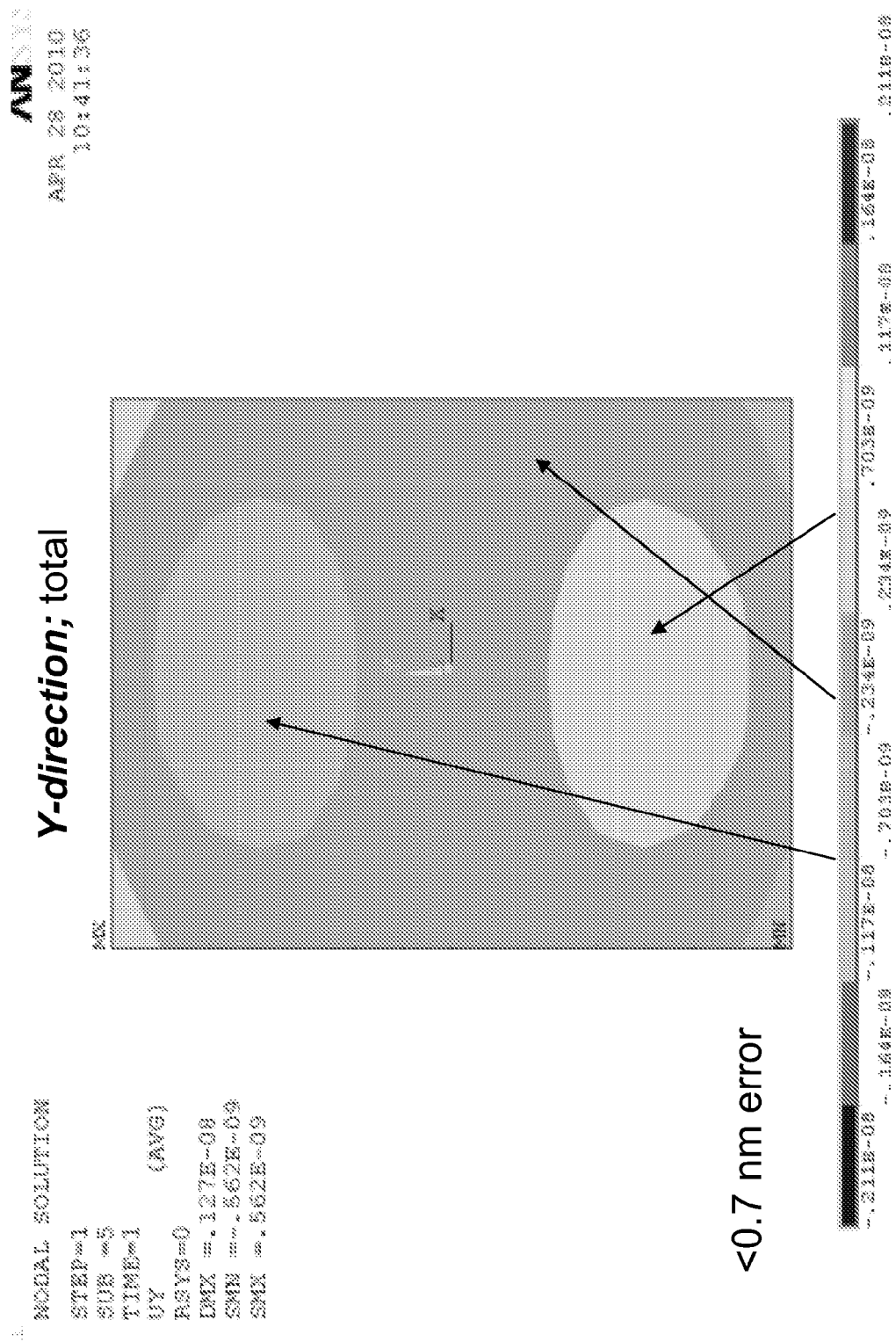

Use is made of a finite element method (FEM) calculation using transient thermo-mechanical analysis. FIG. 5*a* shows a temperature profile of a square object directly after having been provided with a first heat load for 1 second. The thermo-mechanical properties of the object used in the calculations resemble the thermo-mechanical properties of a lithography substrate. The shape of the first area of the object which is provided with the first heat load resembles the shape of a mesa of an imprint template. The first area is in this particular case 26 by 33 mm (see the rectangle in the middle of FIG. 5*b* for the shape of the first area). The intensity of the first heat load is 1 watt which is typical for imprint lithography. FIG. 5*b* and FIG. 5*c* show the resulting deformation of the object in X (left-right) and Y (top-bottom) directions respectively. The deformation shown is the deformation after 1 second, which is the deformation of the object directly after having been provided with the first heat load for 1 second. As the region of interest is the first area FIGS. 5*d* and 5*e* show the deformation in X and Y respectively of this first area in close-up. As can be seen the maximum deformation of the object in the first area is 2.11 nm, which is considerable in nano-technology.

Figure 6C:
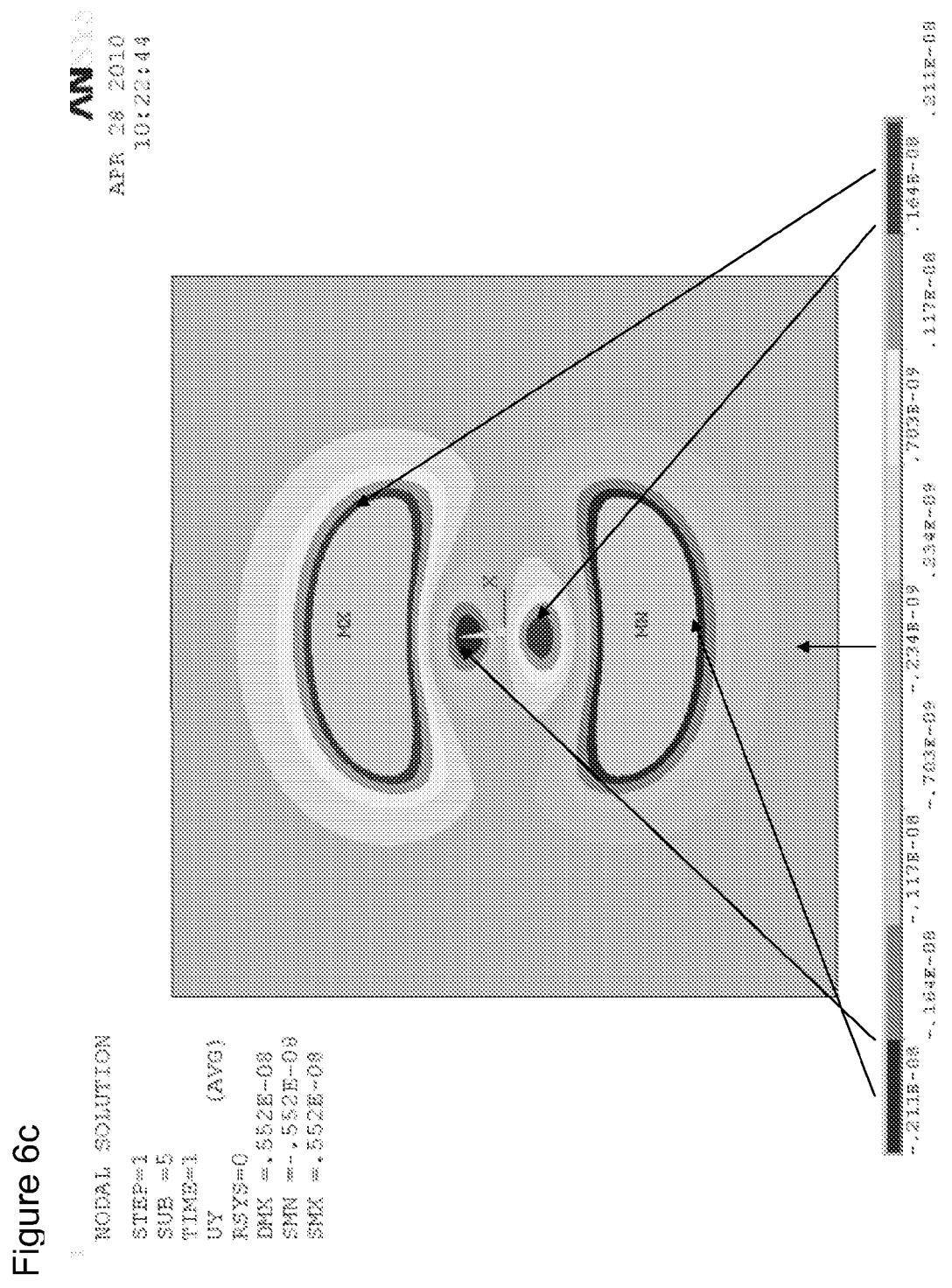

FIGS. 6 *a* to *e* show the same type of information as FIGS. 5 *a* to *e*, however in the case of FIG. 6 not a first heat load is provided to the first area, but a second heat load is provided to the second area (the first heat load of FIG. 5 is not provided). This second area is schematically visualized as 109 in FIG. 4. In this particular case the outer border of the second area is 52 by 66 mm and the inner border of the second area is 26 by 33 mm. The intensity of the second heat load is 7.5 watts. Again the results are shown after 1 second, which is directly after having been provided with the second heat load for 1 second. From FIGS. 6 *b* and *c*, but especially from FIGS. 6 *d* and *e* it can be seen that the deformation in the relevant first area of the object caused by providing the second heat load to the second area is opposite in direction to the direction of deformation caused by providing the first heat load to the first area (also see FIGS. 5 *d* and *e*).

FIGS. 7 *a* to *e* show again the same type of information as FIGS. 5 *a* to *e* and FIGS. 6 *a* to *e*, however in this case both the first heat load is provided to the first area and the second heat load is provided to the second area. This situation of providing both the first and second heat loads demonstrates the positive effect of the an embodiment of invention. From FIGS. 7 *b* and *c* but especially from FIGS. 7 *d* and *e* it can been seen that the deformation in the relevant first area of the object in this case is much smaller than the deformation as shown in FIGS. 5 *d* and *e*. The maximum deformation is reduced from 2.11 nm to about 0.7 nm, which is a considerable decrease. This is achieved by providing a second heat load which is configured to ensure a deformation of the first area of the object caused by providing both the first heat load and the second heat load is smaller than a deformation of the first area of the object caused by providing only the first heat load. It should be noted that even better results may be achieved by optimizing the shape of the second area and the intensity and timing of the second heat load. Although the results are only shown after 1 second (that is, directly after having been provided with the first and second heat loads for 1 second, wherein the first and second heat loads are provided simultaneously), the positive effect of providing the second heat load on the deformation of the first area is also present at other relevant instants in time.

FIG. 8 shows an overview of the aforementioned results in the first area of the object.

Although an embodiment of the invention is described above with reference to an object in the context of a substrate (e.g. wafer) for imprint lithography, an embodiment of the invention is similarly applicable to other areas, e.g. an imprint template, a reticle, or any other suitable object being provided with a first heat load.

In case the object is a reticle (a reticle is an object often used in optical lithography) the first area (see first area 103 of FIG. 4) can be seen as the illuminated area of the reticle. For example, the area of the reticle with the features to be projected onto a substrate. The second area may be, for example, similar to the second area 105 shown in FIG. 4, the object 101 being a reticle (although the object shown in FIG. 4 is a circle, normally a reticle is rectangular). The first heat load may be a beam of radiation illuminating the reticle. The second heat load is a heat load configured to ensure a deformation of the first area of the reticle caused by providing both the first heat load and the second heat load is smaller than a deformation of the first area of the reticle caused by providing only the first heat load.

As mentioned the object may be an imprint template. It may be relevant to apply an embodiment of the invention on the imprint template for example in case the deformation of the first area of the imprint template by providing a first heat load is larger than the deformation of the first area of the substrate by providing the first heat load. Whether this is the case depends on particular circumstances like the thermo-mechanical characteristics of the imprint template and underlying substrate. Also, if the substrate is placed on burls it may also depend on the stiffness of these burls. If the object is an imprint template the first area may be the area of the imprint template illuminated by UV radiation. Thus normally the area of the imprint template with the pattern features, for example the mesa of the imprint template. The second area may be, for example, similar to the second area 105 shown in FIG. 4, the object 101 being an imprint template (although the object shown in FIG. 4 is a circle, normally an imprint template is rectangular). The first heat load may be UV radiation illuminating the pattern features of the imprint template. The second heat load is a heat load configured to ensure a deformation of the first area of the imprint template caused by providing both the first heat load and the second heat load is smaller than a deformation of the first area of the imprint template caused by providing only the first heat load. In the case the object is an imprint template, an embodiment of the invention may be applied in conjunction with adapting the shape (deformation) of the imprint template using one or more template actuators.

It will be clear that an embodiment of the invention is similarly applicable in case the object 101 is a substrate in an optical lithography tool.

The second area 105 of the object 101 may or may not surround the first area 103 of the object 101. An advantage of the second area 105 surrounding the first area 103 (see the embodiment of FIG. 4) may be that the positive effect of the second heat load 109 on the deformation of the first area 103 of the object 101 is present in more or all directions in the plane of the object.

The first area 103 and second area 105 of the object 101 may or may not be spaced apart. In the embodiment shown in FIG. 4 the areas are spaced apart. An advantage of the areas being spaced apart may be that the second heat load 109 has less influence on the temperature of the first area 103 of the object 101. It will be clear this does not mean that the impact of the second heat load 109 on the deformation of the first area 103 of the object 101 is not present. An advantage of the areas not being spaced apart may be the advantageously deforming impact of the second heat load 109 on the first area 103 of the object 101 is larger and/or present at a lower intensity level of the second heat load.

The second area 105 of the object 101 may or may not be concentric with the first area 103 of the object 101. An advantage of the second area 105 of the object 101 being concentric with the first area 103 of the object 101 may be that the positive effect of the second heat load 109 on the deformation of the first area 103 is more evenly distributed across the first area 103.

In an embodiment the second area 105 of the object 101 has an outer and an inner border and the first area 103 of the object 101 has a border (optionally an inner and outer border). In this embodiment the shape of both the outer and inner border of the second area 105 of the object 101 are substantially similar to the shape of the border of the first area 103 of the object 101 (see for example FIG. 4). In another example the first area 103 is circular and the second area 105 has the shape of a circular strip surrounding the circular first area 103. In a further example the first area 103 has a square shape and the second area 105 has a shape with at least two axes of symmetry, for example two or four, surrounding the first area 103. In an embodiment the axes of symmetry of the square first area 103 coincide with the axes of symmetry of the second area 105. In a further example the first area 103 has a circle-symmetric shape and the second area 105 also has a circle-symmetric shape surrounding the first area 103. An advantage of the shapes of the borders/areas being similar may be that it further (inherently) improves the positive effect of the second heat load 109 on the deformation of the first area 103 of the object 101.

In an embodiment the object 101 is a substrate 3 in an imprint lithography apparatus where the mesa of the imprint template 5 is rectangular (for example 26 by 33 mm). In this situation the first area 103 of the object 101 may be substantially rectangular. It may be advantageous if the second area 105 of the object 101 also has a substantially rectangular outer and inner border, wherein the outer and inner borders of the second area 105 of the object 101 are substantially concentric with respect to each other. More generally, it may be advantageous if the outer and inner borders of the second area 105 of the object 101 are substantially concentric with respect to each other.

Besides the positioning and shape of the second area 105 and the first area 103 of the object 101 also the timing of providing the second heat load 109 and the first heat load 107 has an impact on the resulting deformation of the first area 103 of the object 101.

In an embodiment the period in time of providing the second heat load 109 at least partly overlaps with the period in time of providing the first heat load 107. This may be advantageous as the undesirable deformation of the first area 103 of the object 101 caused by providing the first heat load 107 does not occur earlier than the moment in time of actually starting to provide the first heat load 107. A good correlation between the timing of providing the first heat load 107 and providing the second heat load 109 (with its positive effect on the deformation of the first area 103 of the object 101) may be advantageous. This correlation is provided by having at least a partial overlap between the period in time of providing the second heat load 109 and the period in time of providing the first heat load 107.

In an embodiment, the period in time of providing the second heat load 109 starts before the period in time of providing the first heat load 107. The undesirable deformation of the first area 103 of the object 101 caused by providing the first heat load 107 does not start earlier than the moment in time of actually starting to provide the first heat load 107. However, it may be advantageous to start the period in time of providing the second heat load 109 before the period in time of providing the first heat load 107. This may be the case as it may take some time for the second heat load 109 to have a deforming effect in the first area 103. Also, it may take some time for the second heat load 109 to have enough deforming effect in the first area 103. Also, by starting earlier with providing the second heat load 109 the intensity of the second heat load 109 may possibly be decreased as there is more time to build up the desirable effect of the second heat load 109 on the deformation of the first area 103 of the object 101. A lower intensity level of the second heat load 109 may be advantageous for numerous reasons. For example, there may be no need for a high intensity second heat load source. Also, there may be fewer restrictions on the thermal damage tolerance of the object.

In an embodiment, the period in time of providing the second heat load 109 substantially corresponds to the period in time of providing the first heat load 107. This may be advantageous if, for example, the correlation in time between providing the first heat load 105 and the deformation of the first area 103 of the object 101 caused by this first heat load 103 substantially corresponds to the correlation in time between providing the second heat load 109 and the deformation of the first area 103 of the object 101 caused by this second heat load 109.

In an embodiment, the period in time the deformation of the first area 103 of the object 101 caused by providing both the first heat load 107 and the second heat load 109 is smaller than a deformation of the first area 103 of the object 101 caused by providing only the first heat load 107 corresponds to the period in time a pattern is being fixed by the lithography method. This may be advantageous as the positive effect of the second heat load 109 on the deformation of the first area 103 of the object 101 is now present at a highly relevant period in time, which is when a pattern is being fixed by the lithography method. In case the lithography method is an imprint lithography method this helps ensure the positive effect is, for example, present during the time the imprintable medium solidifies.

In an embodiment the object 101 is a substrate 3 or an imprint template 5 and the period in time the deformation of the first area 103 of the object 101 caused by providing both the first heat load 107 and the second heat load 109 is smaller than a deformation of the first area 103 of the object 101 caused by providing only the first heat load 107 ends on or after separating the imprint template 5 and substrate 3. This may be advantageous if the period would end before separating the imprint template 5 and substrate 3 since the pattern features formed by the imprint lithography method might undesirably deform. This may also be the case if the period ends after the pattern is being fixed by the imprint lithography method, but before the imprint template 5 and substrate 3 are separated.

In an embodiment the intensity of the second heat load 109 is between 0.1 and 100, between 0.5 and 20, or between 2 and 10 times the intensity of the first heat load 107. A high second heat load 109 may have as an advantage that its effect on the deformation of the first area 103 is bigger. An advantage of a high second heat load 109 may be that the second area 105 may be smaller. An advantage of a low second heat load 109 may be that only a low second heat load source is required. An advantage of a low second heat load 109 may be that damage to, for example, the object 101 (e.g. imprint template, substrate, reticle) is less likely and/or there are less stringent thermal requirements for hardware coming into contact with the second heat load 109.

Providing the second heat load 109 to the second area 105 of the object 101 can be achieved in various ways. For example, the second heat load 109 may be provided by a beam of radiation from a heat output (e.g., an opening or a mask as described below). This beam of radiation may or may not originate from a radiation source also used for curing imprintable medium or illuminating a reticle. An advantage of a dedicated radiation source to provide the second heat load 109 may be that it provides more flexibility in the intensity of the second heat load 109 and/or wavelength of the beam of radiation to provide the second heat load 109. An advantage of a dedicated radiation source may be more flexibility in the timing of providing the second heat load 109. An advantage of using a single radiation source may be that, although there may be less flexibility in timing, there may be an inherent connection in time between providing the first heat load 107 and the second heat load 109, thus providing a stable system.

In case the second heat load 109 is provided by a beam of radiation provided by a radiation source, a desired shape of the second heat load 109 may be obtained by placing a mask between the radiation source and object 101. This mask may block part of the beam of radiation from the radiation source giving the shape of the second heat load 109. In case it is desired to change the shape of the second heat load 109 this may be achieved by using an adaptable mask. It may be desirable to change the shape of the second heat load 109 depending on the location of the first area 103 on the object 101 (for example, closer to the center of the object or closer to an edge).

The beam of radiation to provide the second heat load 109 may be filtered extreme ultraviolet (EUV) radiation. The beam of radiation to provide the second heat load 109 may be non-actinic radiation. Using non-actinic radiation may be advantageous as, for example, in case of imprint lithography part of the second area 105 may be provided with imprintable medium. By using non-actinic radiation, curing of the imprintable medium present on the second area 105 (without any effective pattern) due to the application of the second heat load 109 to the second area 105 may be prevented. It should be noted that in practice it may also be the case that uncured imprintable medium is only present on the first area 103, which is the area to be imprinted next. In an embodiment, the second heat load 109 is provided by a heated gas.

Figure 9:
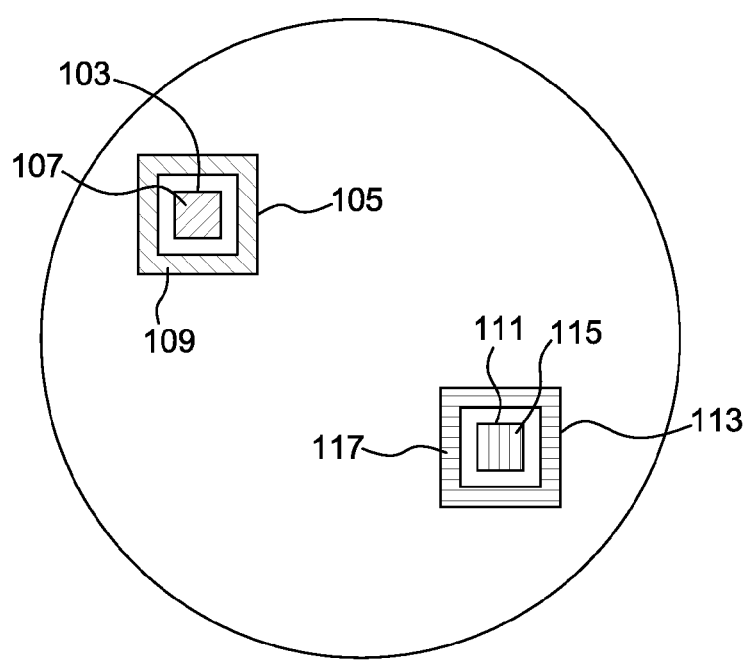
FIG. 9 schematically depicts a further lithography method according to an embodiment of the invention.

FIG. 9 schematically shows an embodiment of the invention in which the object 101 is a substrate and the lithography method further comprises, after providing the first heat load 107 and the second heat load 109, providing a third heat load 115 to a third area 111 of the substrate and a fourth heat load 117 to a fourth area 113 of the substrate in a similar manner as providing the first heat load 107 and the second heat load 109 respectively, wherein the third area 111 of the substrate is positioned with respect to the first area 103 and second area 105 to limit the effect of the first heat load 107 and the second heat load 109 on the third area 111 of the substrate. Thus, the correlation between the first heat load 107 and the second heat load 109, for example the positioning of the first area 103 and the second area 105 with respect to each other, is similar to the correlation between the third area 111 and the fourth area 113. To limit the effect of the first heat load 107 and the second heat load 109 on the third area 111 of the substrate, the third area 111 of the substrate may be spaced relatively far away from the first area 103 and second area 105 of the substrate (see for example the embodiment of FIG. 9). It will be clear that an advantage of limiting the effect, for example substrate deformation, of the first heat load 107 and the second heat load 109 on the third area 111 of the substrate may be an improved pattern at the third area 111. The aforementioned may be repeated multiple times, for example by providing a fifth heat load to a fifth area of the substrate and a sixth heat load to a sixth area of the substrate in a similar manner as providing the first (and/or third) and second (and/or fourth) heat load respectively, wherein the fifth area of the substrate is positioned with respect to the first area 103/second area 105 and third area 111/fourth area 113 to limit the effect of the first 107, second 109, third 115 and fourth 117 heat loads on the fifth area of the substrate. The spacing may be 2 times, 3 times, 4 times or more the minimum width of first area 103.

Figure 10:
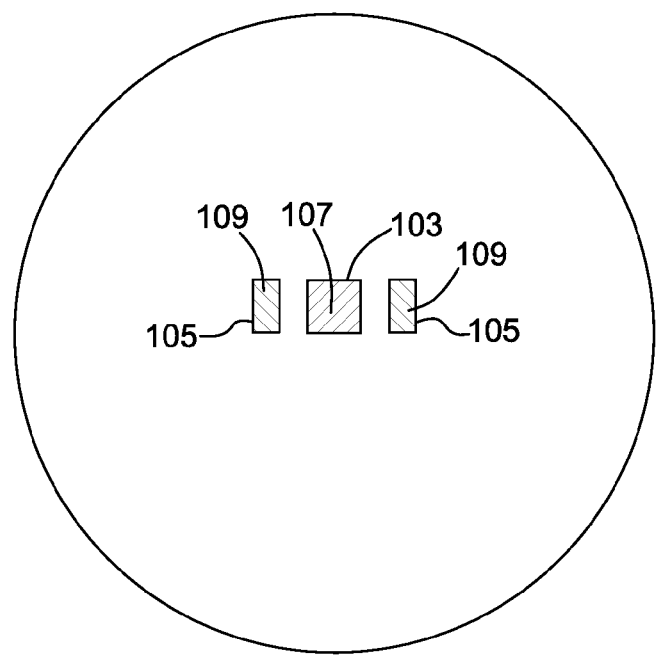
FIG. 10 schematically depicts a further lithography method according to an embodiment of the invention.

FIG. 10 schematically shows an embodiment of the invention wherein the second area 105 of the object 101 comprises two spaced apart subareas each located at different opposite sides of the first area 103 of the object 101. This embodiment may be advantageous in case the positive effect described above on the deformation of the first area 103 of the object 101 should be present in a single direction, that is in the direction going from one of the two spaced apart subareas of the second area 105 to the other of the two spaced apart subareas of the second area 105. In this case the second area 105 and the second heat load 109 may be optimized with this single direction in mind, possibly leading to better results in this single direction. Also, the amount of heat load provided by the second heat load 109 to the object 101 may be lower compared to the case where the positive effect described above is desired in more directions in the plane of the object, for example in the case shown in FIG. 4, which may be advantageous.

In an embodiment of the invention the lithography method further comprises before providing the first heat load 107 and the second heat load 109, calculating a shape (e.g., optimal shape) of the second area 105 of the object 101 and an intensity profile (e.g., optimal intensity profile) of the second heat load 109 based on at least a shape of the first area 103 of the object 101 and an intensity profile of the first heat load 107. The calculations may be performed using a thermo-mechanical finite element method. Using a finite element method various shapes of the second area 105 of the object 101 and various intensity profiles of the second heat load 109 can be tried to get to an optimal shape and intensity profile.

According to an embodiment, the object 101 is a substrate and the lithography method is an imprint lithography method. The method further comprises before providing the first heat load 107 and the second heat load 109, bringing an imprint template into contact with imprintable medium provided on the first area 103 of the substrate; and after providing the first heat load 107 and the second heat load 109, separating the imprint template and substrate, wherein providing the first heat load 107 to the first area 103 of the substrate comprises solidifying the imprintable medium.

According to an embodiment, the object 101 is a substrate and the lithography method is an optical lithography method. In the optical lithography method providing the first heat load 107 to the first area 103 of the substrate comprises projecting a patterned beam of radiation onto the first area 103 of the substrate.

Figure 11:
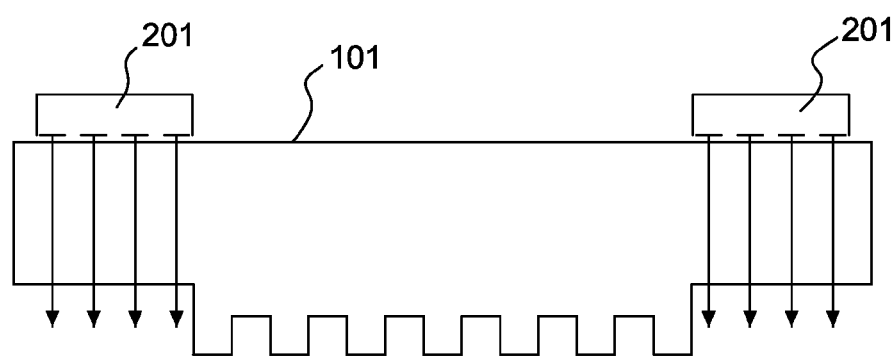
FIG. 11 schematically depicts part of an imprint lithography apparatus according to an embodiment of the invention.

A lithography apparatus according to an embodiment comprises a first heat output (e.g., a first heat source) configured to provide a first heat load 107 to a first area 103 of an object 101; and a second heat output (e.g., second heat source) configured to provide a second heat load 109 to a second area 105 of the object 101 to ensure a deformation of the first area 103 of the object 101 caused by providing both the first heat load 107 and the second heat load 109 is smaller than a deformation of the first area 103 of the object 101 caused by providing only the first heat load 107. In case the lithography apparatus is an imprint lithography apparatus and the object is a substrate, the second heat output or source may be an array of LEDs 201. See, for example, FIG. 11 where the array of LEDs 201 is attached to the imprint template 101.

As discussed with reference to FIGS. 5 to 8, by providing a basic second heat load 109 to a second area 105 of the object 101 (basic meaning a straightforward shape of the second heat load 109, i.e., a straightforward shape of the second area 105, a straightforward intensity profile of the second heat load 109, and a straightforward timing of providing the second heat load 109), a deformation of the first area 103 of the object 101 caused by providing both the first heat load 107 and the second heat load 109 should be smaller than a deformation of the first area 103 of the object 101 caused by providing only the first heat load 107. Various methods can be used to determine how to provide the second heat load 109 to the second area 105 of the object 101. Mentioned finite element methods can be used to, for example, determine the shape of the second area 105 and/or the intensity of the second heat load 109 and/or the timing of providing the second heat load 109. Another method is actual real life testing. For example in the case of imprint lithography, a lot of imprints may be performed before a single substrate is fully imprinted. By changing the mentioned shape, intensity and/or timing over the various imprints and inspecting the resulting imprinted patterns afterwards, a desired shape, intensity and/or timing can be determined. Of course it is also possible to combine finite element methods with real life testing.

Although embodiments of the invention have referred to the use of actinic radiation to cure the imprintable medium, the imprintable medium may be cured using any suitable curing mechanism. The imprintable medium may be solidified using a mechanism other than curing.

Features of one or more of the above described embodiments of the invention may be combined together.

An embodiment of the present invention relates to a lithography apparatus and method. The apparatus and/or method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarization layers or anti-reflection coating layers.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable medium dispensers. In an embodiment, there is provided an apparatus that includes a plurality (e.g. 2, 3, or 4) of liquid (e.g., water) dispensers (e.g. print heads). In an embodiment, there is provided an apparatus configured to use one imprintable medium dispenser per substrate holder and/or one liquid dispensing print head per substrate holder. In an embodiment, there is provided an apparatus configured to use one imprintable medium dispenser per imprint template arrangement and/or one liquid dispensing print head per substrate holder. In an embodiment, where an apparatus is provided that includes a plurality of substrate holders, the substrate holders may share functionalities in the apparatus. For instance, the substrate holders may share a substrate handler, a substrate cassette, a gas supply system (e.g. including apparatus arranged to mix water vapor with the gas), an imprintable medium dispenser, and/or a radiation source (e.g., for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the invention as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim.

Although the problem and an embodiment of the invention is mainly described with imprint lithography in mind (the object being an imprint template and/or substrate), it will be clear, also from the above, that an embodiment of the invention is also or alternatively applicable for optical lithography (the object being a reticle and/or substrate) and generally for lithography (the object being any relevant object).

The invention claimed is:

1. A lithography method comprising:
    providing a first heat load to a first area of an object; and
    providing a second heat load to a second area of the object,
        wherein the first and the second heat loads are provided simultaneously and are configured to provide different intensities using at least one beam of radiation, wherein the second heat load is configured to ensure a deformation of the first area of the object caused by providing both the first heat load and the second heat load is smaller than a deformation of the first area of the object caused by providing only the first heat load, wherein the object is a substrate, an imprint template, or a reticle.

2. The lithography method of claim 1, wherein the second area surrounds the first area.

3. The lithography method of claim 1, wherein the first and second areas are spaced apart.

4. The lithography method of claim 1, wherein the second area is concentric with the first area.

5. The lithography method of claim 1, wherein:
the second area has an outer and an inner border and the first area has a border, and
the shape of both the outer and inner borders of the second area are substantially the same as the shape of the border of the first area.

6. The lithography method of claim 1, wherein:
the second area has a substantially rectangular outer and inner border, and the outer and inner border of the second area are substantially concentric with respect to each other.

7. The lithography method of claim 1, wherein a period in time the deformation of the first area caused by providing both the first heat load and the second heat load is smaller than a deformation of the first area caused by providing only the first heat load corresponds to a period in time a pattern is being fixed by the lithography method.

8. The lithography method of claim 1, wherein the object is a substrate or an imprint template and a period in time the deformation of the first area caused by providing both the first heat load and the second heat load is smaller than a deformation of the first area caused by providing only the first heat load ends on or after separating the imprint template and substrate.

9. The lithography method of claim 1, wherein an intensity of the second heat load is between 2 and 10 times the intensity of the first heat load.

10. The lithography method of claim 1, wherein the second heat load is provided by a second beam of radiation.

11. The lithography method of claim 10, wherein the second beam of radiation is filtered EUV radiation.

12. The lithography method of claim 10, wherein the second beam of radiation is non-actinic radiation.

13. The lithography method of claim 1, wherein the second heat load is provided by a heated gas.

14. The lithography method of claim 1, wherein the object is a substrate and the method further comprises:

after providing the first and second heat loads, providing a third heat load to a third area of the substrate and providing a fourth heat load to a fourth area of the substrate in a similar manner as providing the first and second heat loads respectively, wherein the third area is positioned with respect to the first and second areas to limit the effect of the first and second heat loads on the third area.

15. The lithography method of claim 1, wherein the second area comprises two spaced apart subareas each located at different opposite sides of the first area.

16. The lithography method of claim 1, further comprising before providing the first and second heat loads, calculating a shape of the second area and an intensity profile of the second heat load based on at least a shape of the first area and an intensity profile of the first heat load.

17. The lithography method of claim 16, wherein the calculating the shape of the second area and the intensity profile of the second heat load is performed using a finite element method.

18. The lithography method of claim 1, wherein the object is a substrate and the lithography method is an imprint lithography method, the method further comprising:
before providing the first and second heat loads, bringing an imprint template into contact with an imprintable medium provided on the first area; and
after providing the first and second heat loads, separating the imprint template and substrate,
wherein providing the first heat load to the first area comprises solidifying the imprintable medium.

19. The lithography method according to claim 1, wherein the object is a substrate, the lithography method is an optical lithography method, and providing the first heat load to the first area comprises projecting a patterned beam of radiation onto the first area.

20. A lithography apparatus comprising:
a first heat output configured to provide a first heat load to a first area of an object; and
a second heat output configured to provide a second heat load to a second area of the object;
wherein the second heat output ensures a deformation of the first area of the object caused by providing both the first heat load and the second heat load is smaller than a deformation of the first area of the object caused by providing only the first heat load,
wherein the first and the second heat loads are provided simultaneously and are configured to provide different intensities using at least one beam of radiation, wherein the object is a substrate, an imprint template, or a reticle.

* * * * *